US007808831B2

United States Patent
Mokhlesi et al.

(10) Patent No.: US 7,808,831 B2
(45) Date of Patent: Oct. 5, 2010

(54) READ DISTURB MITIGATION IN NON-VOLATILE MEMORY

(75) Inventors: Nima Mokhlesi, Los Gatos, CA (US); Klaus Schuegraf, San Jose, CA (US)

(73) Assignee: Sandisk Corporation, Milpitas, CA (US)

( * ) Notice: Subject to any disclaimer, the term of this patent is extended or adjusted under 35 U.S.C. 154(b) by 207 days.

(21) Appl. No.: 12/165,302

(22) Filed: Jun. 30, 2008

(65) Prior Publication Data

US 2009/0323412 A1 Dec. 31, 2009

(51) Int. Cl.
*G11C 16/06* (2006.01)

(52) U.S. Cl. ............... 365/185.21; 365/185.02; 365/185.09; 365/185.18

(58) Field of Classification Search ............ 365/185.21, 365/185.02, 185.09, 185.18
See application file for complete search history.

(56) References Cited

U.S. PATENT DOCUMENTS

| 5,038,703 | A | 8/1991 | Frush |
| 5,867,429 | A | 2/1999 | Chen |
| 6,018,477 | A | 1/2000 | Wang |
| 6,026,024 | A | 2/2000 | Odani et al. |
| 6,587,378 | B2 | 7/2003 | Hassan et al. |
| 6,657,891 | B1 | 12/2003 | Shibata et al. |
| 6,668,303 | B2 | 12/2003 | Pio |
| 6,707,714 | B2 | 3/2004 | Kawamura |
| 6,751,766 | B2 | 6/2004 | Guterman et al. |
| 6,879,520 | B2 | 4/2005 | Hosono et al. |
| 6,961,267 | B1 | 11/2005 | Fastow et al. |
| 7,012,835 | B2 | 3/2006 | Gonzalez et al. |
| 7,057,935 | B2 | 6/2006 | Chevallier |
| 7,141,763 | B2 | 11/2006 | Moroz |
| 7,173,851 | B1 | 2/2007 | Callahan et al. |
| 7,177,977 | B2 | 2/2007 | Chen et al. |
| 7,187,592 | B2 | 3/2007 | Guterman et al. |
| 7,193,901 | B2 | 3/2007 | Ruby et al. |
| 7,196,928 | B2 | 3/2007 | Chen |
| 7,262,994 | B2 | 8/2007 | Fong et al. |
| 7,310,272 | B1 | 12/2007 | Mokhlesi et al. |
| 7,447,076 | B2 * | 11/2008 | Mokhlesi ............ 365/185.18 |

(Continued)

OTHER PUBLICATIONS

U.S. Appl. No. 11/941,946, titled "Adaptive dynamic reading of flash memories," filed Nov. 18, 2007.

(Continued)

*Primary Examiner*—Connie C Yoha
(74) *Attorney, Agent, or Firm*—Vierra Magen Marcus & DeNiro LLP

(57) ABSTRACT

Read disturb is reduced in non-volatile storage. In one aspect, when a read command is received from a host for reading a selected word line, a word line which is not selected for reading is randomly chosen and its storage elements are sensed to determine optimized read compare levels for reading the selected word line. Or, a refresh operation may be indicated for the entire block based on an error correction metric obtained in reading the storage elements of the chosen word line. This is useful especially when the selected word line is repeatedly selected for reading, exposing the other word lines to additional read disturb. In another aspect, when multiple data states are stored, one read compare level is obtained from sensing, e.g., from a threshold voltage distribution, and other read compare levels are derived from a formula.

26 Claims, 15 Drawing Sheets

U.S. PATENT DOCUMENTS

| | | |
|---|---|---|
| 7,684,247 B2 * | 3/2010 | Mokhlesi ............... 365/185.18 |
| 2005/0162913 A1 | 7/2005 | Chen |
| 2006/0101193 A1 | 5/2006 | Murin |
| 2007/0091677 A1 | 4/2007 | Lasser |
| 2007/0101238 A1 | 5/2007 | Resnick |
| 2007/0211532 A1 | 9/2007 | Gonzalez |
| 2007/0279982 A1 | 12/2007 | Shibata |
| 2007/0291546 A1 | 12/2007 | Kamei |

OTHER PUBLICATIONS

International Search Report and Written Opinion of the International Searching Authority, dated Aug. 28, 2009, PCT Patent Appl. No. PCT/US2009/048990.

* cited by examiner

READ DISTURB MITIGATION IN NON-VOLATILE MEMORY

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Pat. No. 6,917,542, titled "Detecting Over Programmed Memory," issued Jul. 12, 2005; both of which are incorporated herein by reference in their entirety.

However, one issue which continues to be problematic is read disturb. Read disturb is the unintentional changing of the state of a storage element while reading another storage element. Moreover, the problem is made worse for newer devices which use a reduced tunnel oxide thickness, as well as for devices which have experienced many program/erase cycles.

SUMMARY OF THE INVENTION

The present invention addresses the above and other issues by providing a method for reducing read disturb in a non-volatile storage system.

In one embodiment, a method for operating non-volatile storage includes receiving a read command requesting to read data from at least one selected non-volatile storage element in a set of non-volatile storage elements, where the at least one selected non-volatile storage element is associated with a selected word line in a set of word lines. The method further includes, in response to the read command, selecting another word line in the set of word lines, performing sense operations on non-volatile storage elements which are associated with the another word line, and, based on the sense operations, determining at least one read compare level. The method further includes reading the at least one selected non-volatile storage element using the at least one read compare level.

In another embodiment, a method for operating non-volatile storage includes receiving a read command requesting to read data from at least one selected non-volatile storage element in a set of non-volatile storage elements, where the at least one selected non-volatile storage element is associated with a selected word line in a set of word lines. The method further includes, in response to the read command, selecting another word line in the set of word lines, sensing data from non-volatile storage elements which are associated with the another word line, including performing an error correction process, and determining a metric based on the error correction process. If the metric is below a threshold, the method further includes reading the at least one selected non-volatile storage element using at least one read compare level which is determined based on the data sensed from the non-volatile storage elements which are associated with the another word line. If the metric is above the threshold, the method further includes further investigating integrity of the data in the set of non-volatile storage elements and/or performing a refresh operation for the data in the set of non-volatile storage elements.

In another embodiment, a method for operating non-volatile storage includes receiving a read command requesting to read data from at least one selected non-volatile storage element in a set of non-volatile storage elements, where the set of non-volatile storage elements stores data in multiple data states, and the at least one selected non-volatile storage element is associated with a selected word line in a set of word lines. The method further includes, in response to the read command, selecting another word line in the set of word lines, performing sense operations on non-volatile storage elements which are associated with the another word line to distinguish adjacent states of a first pair of data states of the multiple data states from one another, and, based on the sense operations, determining a first read compare level which is between the adjacent data states of the first pair of data states. The method further includes determining a second read compare level which is between adjacent data states of a second pair of data states of the multiple data states, based on the first read compare level, and without performing sense operations for distinguishing the adjacent states of the second pair of data states from one another, and reading the at least one selected non-volatile storage element using at least the second read compare level.

In another embodiment, a method for operating non-volatile storage includes receiving a read command requesting to read data from a set of non-volatile storage elements, where the set of non-volatile storage elements stores data in multiple data states. The method further includes, in response to the read command, performing sense operations to distinguish adjacent states of a first pair of data states of the multiple data states from one another, and, based on the sense operations, determining a first read compare level which is between the adjacent data states of the first pair of data states. The method further includes determining a second read compare level which is between adjacent data states of a second pair of data states of the multiple data states, based on the first read compare level, and without performing sense operations for distinguishing the adjacent states of the second pair of data states from one another, and reading at least one selected non-volatile storage element using at least the second read compare level.

In another embodiment, a non-volatile storage system includes a set of non-volatile storage elements, including at least one selected non-volatile storage element. The system further includes a set of word lines associated with the set of non-volatile storage elements, including a selected word line, where the at least one selected non-volatile storage element is associated with the selected word line. The system further includes at least one control in communication with the set of word lines. The at least one control: (a) receives a read command requesting to read data from the at least one selected non-volatile storage element which is associated with the selected word line, (b) in response to the read command, selects another word line in the set of word lines, performs sense operations on non-volatile storage elements which are associated with the another word line, and based on the sense operations, determines at least one read compare level, and (c) reads the at least one selected non-volatile storage element using the at least one read compare level.

Corresponding methods, systems and computer- or processor-readable storage devices for performing the methods provided herein may be provided.

DETAILED DESCRIPTION

The present invention provides a method for reducing read disturb in a non-volatile storage system.

Figure 1:
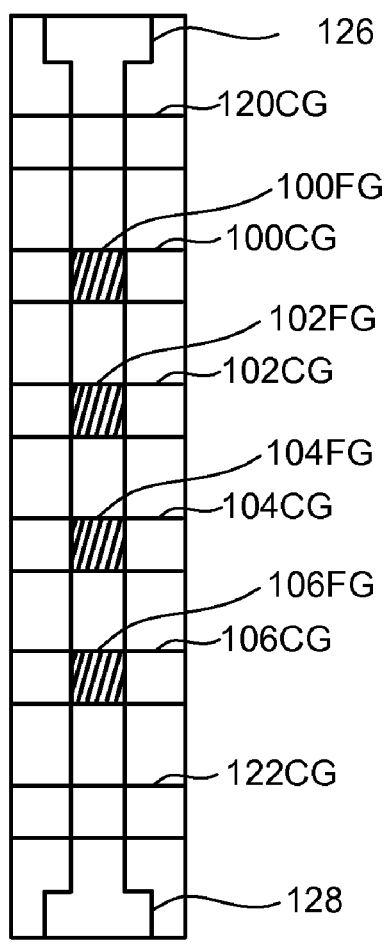
FIG. 1 is a top view of a NAND string.
Figure 2:
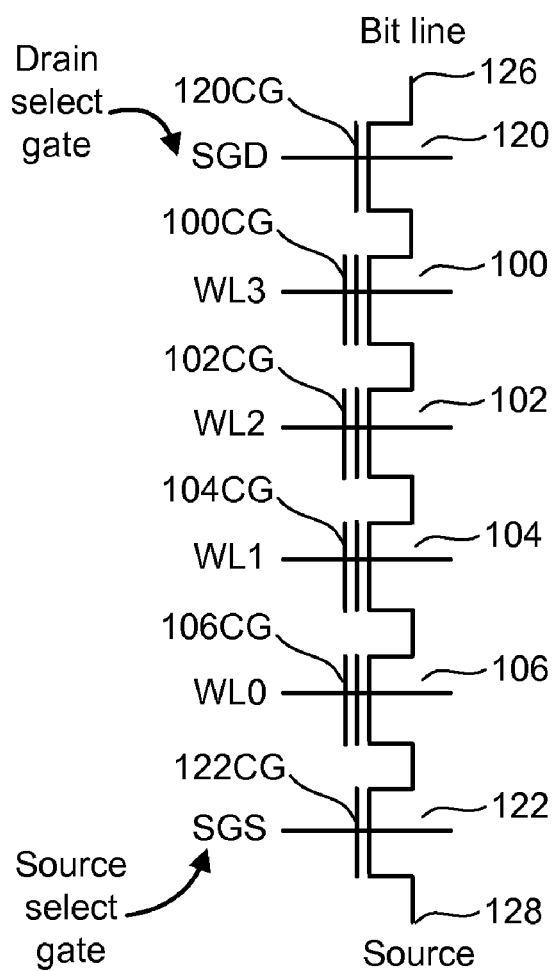
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD. Select gate 122 is connected to select line SGS.

Figure 3:
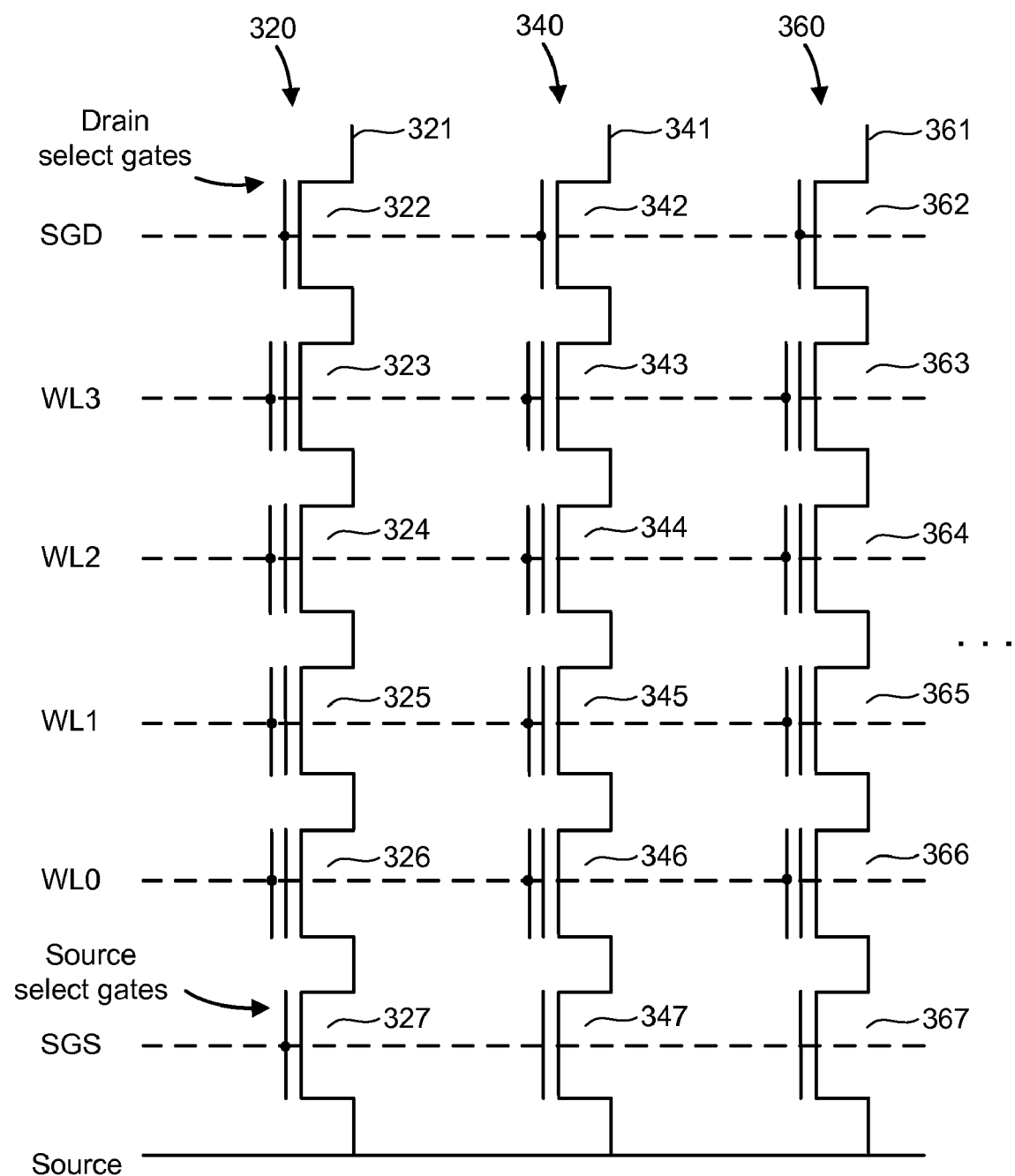
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements.

Relevant examples of NAND type flash memories and their operation are provided in U.S. Pat. Nos. 5,386,422, 5,570, 315, 5,774,397, 6,046,935, 6,456,528 and 6,522,580, each of which is incorporated herein by reference.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory.

For example, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if a pass voltage, $V_{PASS}$, is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the $V_{TH}$ of a charge storage element due to capacitive coupling with other neighboring storage elements that are programmed later, can also contribute to program disturb.

Figure 4:
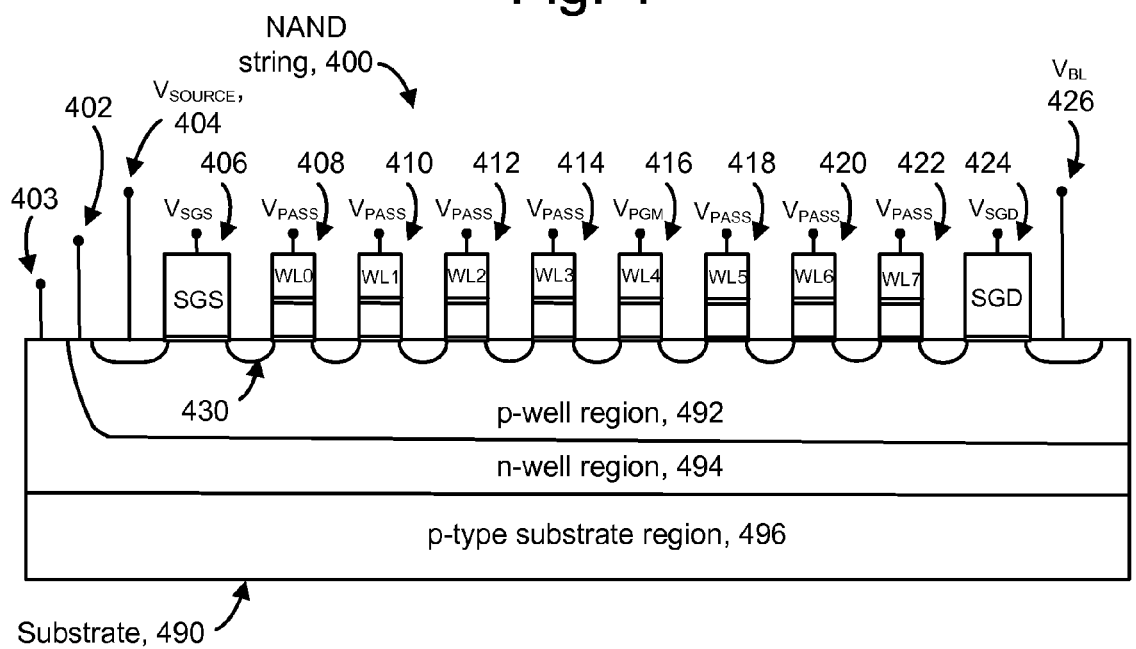
FIG. 4 depicts a cross-sectional view of a NAND string formed on a substrate.

FIG. 4 depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages, such as body bias voltages, can also be applied to the p-well region 492 via a terminal 402 and/or to the n-well region 494 via a terminal 403.

During a program operation, a control gate voltage $V_{PGM}$ is provided on a selected word line, in this example, WL3, which is associated with storage element 414. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{PASS}$ is applied to the remaining word lines associated with NAND string 400, in one possible boosting scheme. Some boosting schemes apply different pass voltages to different word lines. $V_{SGS}$ and $V_{SGD}$ are applied to the select gates 406 and 424, respectively.

Figure 5A:
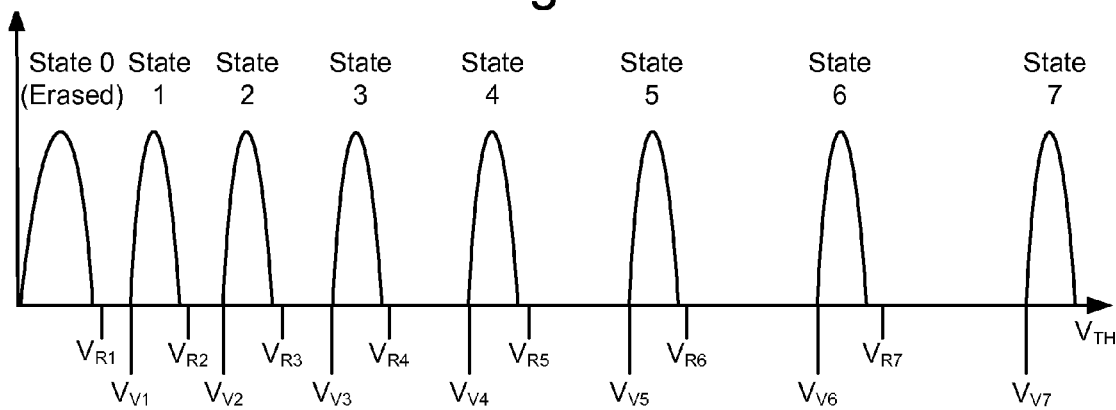
FIG. 5a depicts an initial threshold voltage distribution of a set of non-volatile storage elements, with corresponding verify and read voltages.
Figure 5B:
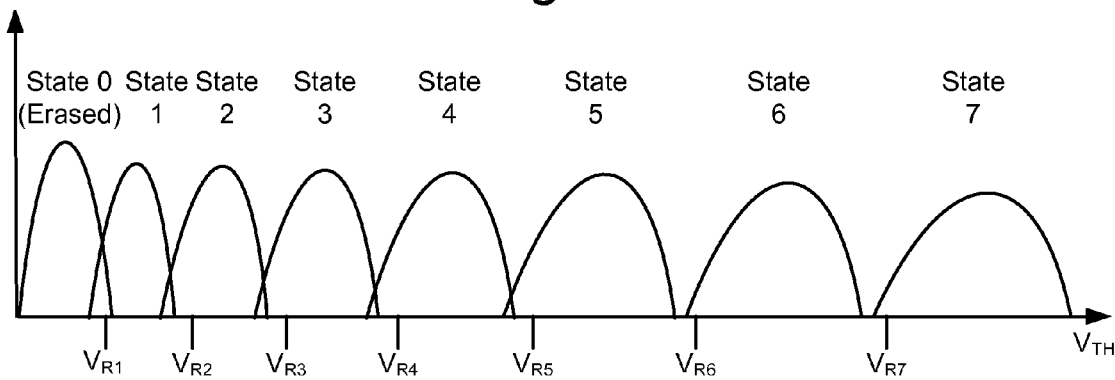
FIG. 5b depicts the threshold voltage distribution of a set of non-volatile storage elements experiencing read disturb.
Figure 5C:
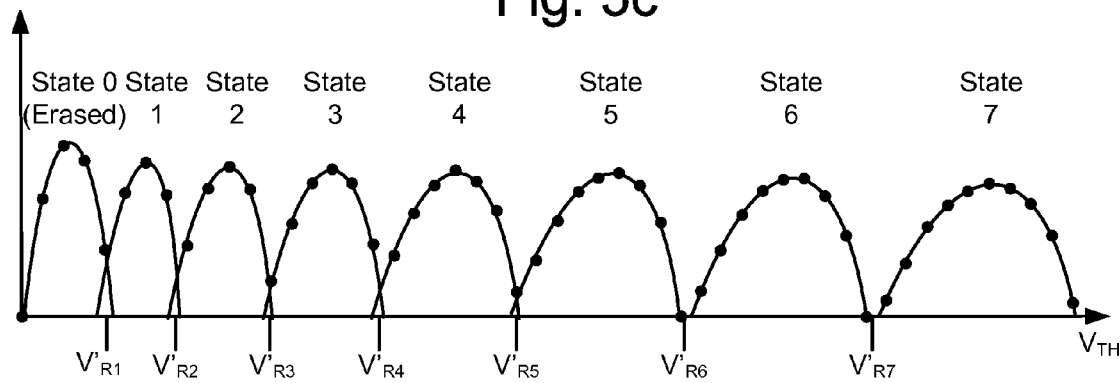
FIG. 5c depicts measurement of the threshold voltage distribution of FIG. 5b and setting of corresponding read voltages.

FIGS. 5a-c relate to how read disturb can change the threshold voltage distribution of a set of non-volatile storage elements, and to a process for addressing this issue. FIG. 5a depicts an initial threshold voltage distribution of a set of non-volatile storage elements, with corresponding verify and read voltages. For instance, the initial threshold voltage distribution may apply just after a set of storage elements has been programmed. In this example, eight data states are used. Generally, two or more data states may be used.

The verify levels $V_{V1}$ through $V_{V7}$ are used during programming to define the lowest threshold voltage to which a storage element must be programming in order for programming to be considered completed. Some storage elements overshoot the verify level to different degrees, resulting in a finite threshold distribution for each state.

Further, it is more important to provide accurate read compare levels, also referred to as read reference voltages, as the number of data states increases and the data states are closer together. In this example implementation, read compare levels $V_{R1}$ through $V_{R7}$ are used to distinguish eight data states in a read process. For example, if $V_{R1}$ is applied to the control gate of a storage element and the storage element becomes conductive, it can be concluded that $V_{R1}$ is greater than the threshold voltage ($V_{TH}$) of the storage element. Similarly, if the storage element is not conductive, it can be concluded that $V_{R1}$ is less than the threshold voltage ($V_{TH}$) of the storage element. Thus, by determining whether or not a storage element is conductive for each of the read compare levels, the data state of the storage element can be ascertained. In other words, the data state of a storage element is the state which is between the highest read compare level at which the storage element is non-conductive and the lowest read compare level at which the storage element is conductive. Furthermore, the read process can ascertain the data states of multiple storage elements which are associated with a given word line at the same time.

Note also that the corresponding read compare voltages, e.g., $V_{R1}$ through $V_{R7}$, are between the voltage groups, typically just above the previous distribution, e.g., $V_{R1}$ is between state 0 and state 1, just above the distribution of state 0, $V_{R2}$ is between state 1 and state 2, just above the distribution of state 1, and so forth. This allows for widening of the threshold voltage distribution due to read disturb and data retention loss. The effect is typically greater for the higher states. As a result, it can be desirable to provide a progressively greater spacing between states for the higher states, as depicted.

As mentioned, read disturb can cause significant changes in threshold voltage distribution. Read disturb tends to decrease positive threshold voltages due to a charge loss from the storage element and increase negative threshold voltages due to a charge gain in the storage element. In some devices, the erased state and perhaps a small number of additional neighboring states have a negative threshold voltage. For example, a 16-state device may have states 0-4 with a negative threshold voltage, and states 5-15 with a positive threshold voltage. On the other hand, in other devices, all states may have a positive threshold voltage.

FIG. 5b depicts the threshold voltage distribution of a set of non-volatile storage elements experiencing read disturb. The read reference voltages $V_{R1}$ through $V_{R7}$ which are depicted are the same as in FIG. 5a. Here, the threshold voltage distribution for each state is wider and shifted downwards compared to the distribution shown in FIG. 5a due to read disturb. Moreover, read disturb can be higher for higher data states so that the shift is greater. Note that the distributions for adjacent data states can also overlap in some cases. Here, it can be seen that read errors can result if the same read voltages of FIG. 5a are used to read the data states represented in FIG. 5b since the read voltages are overlapped by a lower threshold voltage distribution in this example.

Further, read disturb can be influenced by various factors such as: number of programming/erasing cycles (read disturb becomes greater with more cycles as storage elements are repeatedly stressed), temperature changes between the time data is written and when it is read (more disturb occurs at higher temperatures), the relative location of a storage element in a block (less disturb occurs for end word lines in a block since they only have one adjacent word line to be influenced by), a level of the power supply in the memory device (the level can possible vary between the time data is written and when it is read, and read disturb becomes greater with a greater voltage applied to a storage element), program voltage level (higher program level causes more stress resulting in more read disturb), erase voltage level (higher erase level causes more stress resulting in more read disturb), and the duration that a program, read or erase voltage is applied (a longer duration causes more stress resulting in more read disturb).

FIG. 5c depicts measurement of the threshold voltage distribution of FIG. 5b and setting of corresponding read voltages.

The process of measuring the actual threshold distribution involves reading the memory device in several separate read or sense operations, where the number of read operations is based on the desired resolution of the distribution measurement. If, for example, the memory device uses eight states, representing three bits per storage element, and a resolution of ten points per state is desired, then read operations are performed for each of seventy-nine voltage threshold levels. In FIG. 5c, each dot represents a read point, and the solid line is the same as in FIG. 5b. A histogram can be provided in which the height of each bin indicates the number of storage elements whose threshold voltage is in a range specified by the bin. The most appropriate read level can be determined, e.g., as the minima between adjacent states. When there is a range of minima, the most appropriate read level between two data states can be just above the distribution of the lower of the two states. Here, the read levels $V'_{R1}$ through $V'_{R7}$ have been shifted to optimal levels relative to the $V_{R1}$ through $V_{R7}$ levels of FIG. 5b. Generally, as mentioned, it is desirable to put the read level as close as possible to the previous level to also allow for maximum data retention shift. The use of the read levels V'R1 through V'R7 avoids substantial read errors which would otherwise result if the read levels of FIG. 5b were used.

Read disturb is a primary reliability issue in non-volatile storage such as NAND flash memory chips. Read disturb occurs when a storage element is stressed when it is subject to a voltage during a read operation. A voltage of greater magnitude and duration causes greater stress. The number of times the voltage is applied is also a factor, with additional applications being associated with additional stress. Regarding the voltage magnitude, when a selected word line in a block is being read (with an applied control gate read voltage referred to as $V_R$), the unselected word lines in the same block are driven to a high voltage (referred to as a read-pass voltage or $V_{READ}$) in order to bypass the unselected storage elements in the NAND strings. Further, the read-pass voltage is designed to exceed the highest $V_R$ (e.g., $V_{R7}$ when there are eight data states) by a margin such as 2 V, which results in overdriving of the unselected storage elements on the unselected word lines. Moreover, the effective read-pass voltage for a four bit per storage element technology (e.g., having sixteen data states) can be much higher than that for binary (two data states) and two bit (for data states) per storage element memories. Thus, as future devices move toward providing additional data states, read disturb issues will become more significant.

Regarding the voltage magnitude, for an eight state (three bit per storage element) device, there can be (8×4)−1=31 read compare operations. Further, assume 100,000 read operations occur in a desired lifetime. With 100,000 read operations and zero soft bits (e.g., a sequential read at fifteen different read levels), the duration of the exposure of a block is: 100,000× 31×(duration of exposure to each $V_{READ}$). Further, the time needed to read all storage elements on one word line depends on whether one strobe or two strobe sensing is used. The total exposure time with two strobe sensing will be almost double that with one strobe sensing. This, it can be seen that the storage elements will be exposed to significant stress based on the magnitude and duration of the applied read pass voltages.

Read scrubbing can be used to rewrite data on blocks that have been read too often. One implementation of read scrubbing is based on every read triggering a small chance that the block is rewritten. The small chance is created by using a random number generator. The use of a random number generator is easier than maintaining a count of the actual number of reads. However, this approach is resource intensive and does not take into account the actual condition of the storage elements. In another possible approach, the storage elements store data which is encoded using an error correction code (ECC), and an ECC decoding engine is monitored during reading to determine the degree to which the data is errored. For example, the time need for the ECC decoding engine to converge, or the number of iterations needed to converge, can be monitored. If these metrics exceed a threshold, a rewrite is indicated.

In particular, when a strong ECC (SECC) is used, there exists less of a sharp cutoff point separating the conditions necessary for ECC not to work from conditions that allow ECC to correct the data. A strong ECC can correct up to, e.g., 5-8% of bit errors. This is because, with SECC, there is practically no chance of a miss-correction. When the number of failing bits on the ECC page becomes too large, the SECC algorithm will not converge. But, before this condition is reached, the convergence slows down. The time it takes, or the number of iterations that is necessary to achieve SECC convergence, can serve as an early warning flag. When SECC convergence takes too long, or when the number of failing bits on an ECC page exceeds some predetermined value, the controller can initiate investigative reads of data, or of distribution margins, in order to determine if the block has to be rewritten.

One issue that arises is that sometimes the user is interested in repeatedly reading the same chunk of data that is confined to a single word line in a particular block. Since only the unselected word lines in the block will be exposed to read disturb, under such circumstances reading the selected single word line of interest will not raise a flag at an appropriate time regarding the need to refresh data on the rest of the block. Also, note that when wear leveling is employed, rewriting a block's data will move the data to some other physical block. Thus, in some situations, one or more selected storage elements of a particular word line may be read repeatedly, exposing storage elements on other word lines to read disturb, while the one or more selected storage elements themselves avoid program disturb. Selected storage elements of a particular word line may be read repeatedly in various situations, such as when commonly requested data is stored on a particular word line.

As a result, the ECC decoding engine may not indicate a problem when decoding data from the selected storage elements of the particular word line. However, when storage elements of another word line (which have experienced more read disturb) are subsequently read, the ECC decoding engine may indicate a significant problem, such as slow or time-consuming convergence, or may not even converge. Essentially, it may be too late to correct a problem which is found. Thus, the ability to monitor a progressive degradation in the performance of the ECC decoding engine, and to make an appropriate decision as to when to perform a refresh or take other remedial action, is impaired.

Read levels can be determined based on the current threshold voltage distribution of a set of storage elements, such as storage elements of a particular word line, as explained above in connection with FIG. 5c. This is a form of dynamic sense point acquisition (DSPA), and can be performed on a regular basis, e.g., for every read or every n>1 reads in a block, or on an exception basis, e.g., when an ECC decoding engine metric is exceeded, indicating difficulty in converging. Dynamic sense points acquisition can includes reading one or more pages using 1, 2, or more soft bits (i.e., reading at a higher resolution than seven read levels for an eight state storage element) in order to determine how much the read compare levels have to offset from a baseline level. Charge gain/loss is one of the mechanisms that can be addresses by dynamic sense point acquisition.

Figure 6:
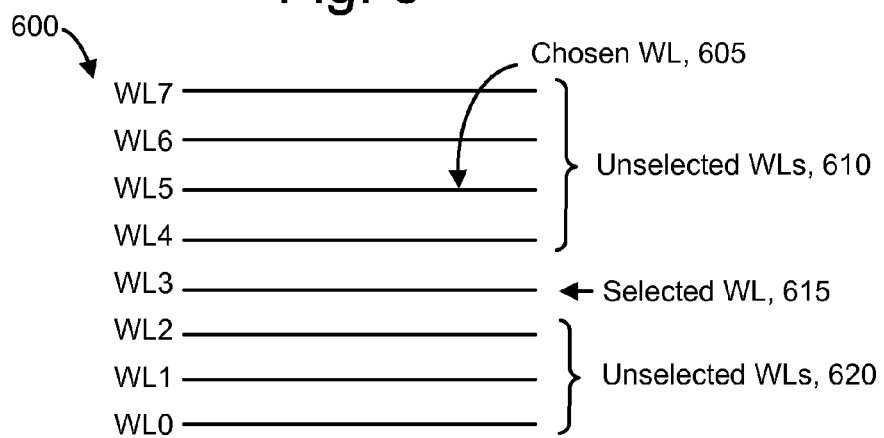
FIG. 6 depicts a selected word line in a set of word lines.

FIG. 6 depicts a selected word line in a set of word lines. A set of word lines 600 has eight word lines WL0-WL7 in this example. A selected word line 615 is the word line which is selected for reading, e.g., based on a host read command. This word line has storage elements which store data of interest. The remaining word lines include a set of unselected word lines 620 on a source side of the selected word line 615, and a set of unselected word lines 610 on a drain side of the selected word line 615. A chosen word line 605 is an unselected word line that is randomly or otherwise chosen to be read before reading the selected word line 615 in order to obtain updated, optimized read voltages.

In one aspect, dynamic sense point acquisition can be performed on a randomly chosen unselected word line, when a read command is received for reading a selected word line. In one approach, any unselected word line may be chosen. In another approach, any unselected word line may be chosen with one or more exceptions. For example, the first and last few word lines in a block, and the word lines which are adjacent to the selected word line, may be excluded, as these may experience more or less read disturb than other word lines.

For example, assume 64 word lines labeled WL0-WL63 and a selected word line WW5. The predetermined set of word lines suitable for DSPA characterization may, for example, be WL1-WL3 and WL7-WL60, assuming WL0 and WL61 are excluded as end word lines, and WL4 and WL6 are excluded since they are adjacent to WL5. Consider also a scenario where the host (or the controller) repeatedly wants to read WL5. In this case, in one possible approach, every command issued to read WL5 will result in another word line being read first. While this another word line is being read for DSPA purposes, WL5 is being exposed to read disturb due to its exposure to $V_{READ}$. Then, when WL5 is subsequently read, the ECC decoding engine metric for WL5 which is monitored will be more representative of the block. Thus, an accurate early warning of a read disturb problem in the block can be obtained so that the controller can perform a corrective action such as refreshing the block or rewriting it to another block before the read disturb problem becomes large enough to overwhelm the ECC decoding engine. This approach allows for read scrubbing only when needed.

Figure 7:
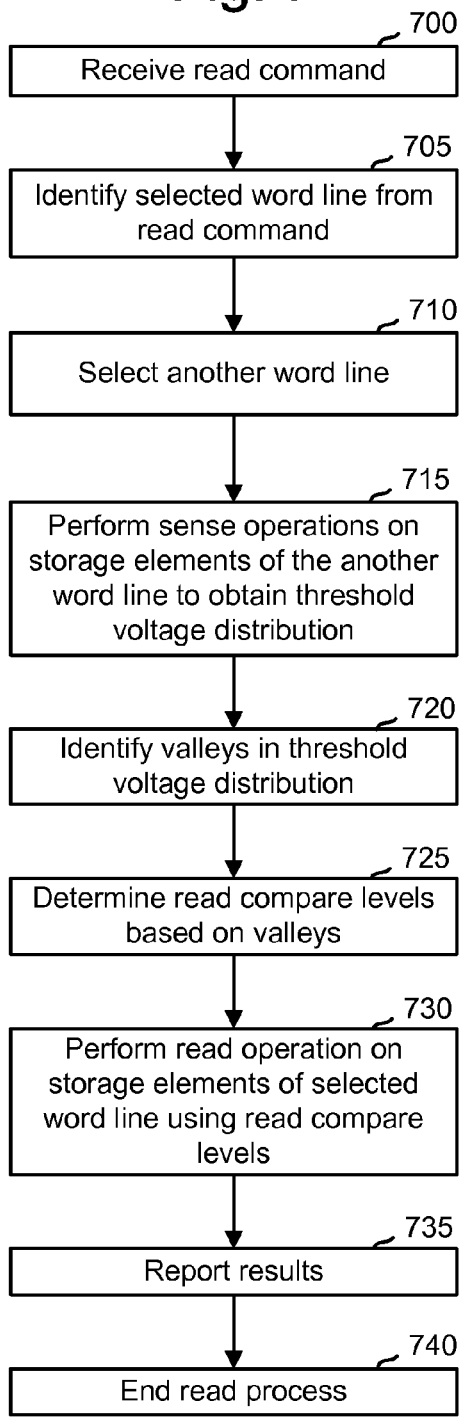
FIG. 7 depicts a process for setting read compare levels for reading a selected word line based on another word line.

FIG. 7 depicts a process for setting read compare levels for reading a selected word line based on another word line. The process can include receiving a read command at step 700. For example, a controller of a memory device may receive a read command from an external host controller. It is also possible for the controller to issue a read command for data it uses internally, without regard to a host controller. Step 705 includes identifying the selected word line from the read command. Typically, the word line is identified by a code word in the read command. Step 710 includes selecting another word line. For example, this can include randomly selecting another word line. In one possible approach, certain word lines are excluded, such as those which are adjacent to the selected word line or are end-of-block word lines. Such word lines may have a higher degree of read disturb, especially on the word line which is adjacent to the selected word line on the drain side. By avoiding such word lines, a word line which has a degree of read disturb which is more representative of the overall block is selected.

However, another possible approach in step 710 is to select an adjacent word line, such as the word line which is adjacent to the selected word line on the drain side. This is generally an unprogrammed or only partly programmed word line when programming proceeds from source to drain sides of a block. This involves selecting a word line which has a worst case degree of read disturb in the overall block. If the selected word line is the last drain side word line, the adjacent word line on the source side may be selected.

Step 715 includes performing sense operations on storage elements of the another word line to obtain a threshold voltage distribution of those storage elements. For example, this can involve performing successive sense operations with the word line voltage at several different levels as represented by each of the points represented by dots in FIG. 5c. Step 720 includes identifying valleys in the threshold voltage distribution, and step 725 includes determining read compare levels based on the valleys. For example, see the optimized read compare levels $V'_{R1}$-$V'_{R7}$ in FIG. 5c.

Once these optimized read compare levels are determined, step 730 includes performing a read operation on the non-volatile storage elements of the selected word line using the optimized read compare levels. Step 735 includes reporting the results, such as transferring the read data from a buffer in the memory device to the host controller. The read process ends at step 740.

Consider an example with sixty four word lines labeled WL0-WL63. If the user requests to read a page on WL5 of a block, WL5 is the selected WL. In this case, first a DSPA operation is performed on another word line which is randomly or otherwise chosen from a predetermined set of word lines suitable for DSPA characterization. A random number generator may be used to choose the another WL. Alternatively, the another WL can be chosen non-randomly, such as by selecting a word line which is offset from the selected word line by a given number of word lines, e.g., choose WL15 when WL5 is the selected word line, choose WL45 when WL35 is the selected word line, and so forth, where the offset is +10 word lines. When the selected word line is close to the drain side, the another WL may be chosen by an offset in the opposite direction, e.g., −10 word lines, or by a modulo calculation in which the counting continues at the first eligible source side word line, e.g., choose WL8 when WL60 is the selected word line. In this case, the end word lines WL0 and WL63 are excluded.

In another example approach, the offset from the selected word line to the another word line is changed, e.g., by +10 word lines for each read operation. Thus, we choose WL15 when WL5 is first read, then WL25 when WL5 is read again, and so forth. In yet another example approach, a subset of word lines is selected randomly or non-randomly, and a particular word line within the subset is selected randomly or non-randomly. For example, with WL5 again as the example selected word line, subsets of word lines may be defined as follows: WL7-15 (excludes the adjacent word line WL6), WL16-25, WL26-35, WL36-45, WL46-55, WL56-62 and WL1-WL3 (excludes the end word lines WL63 and WL0 and the adjacent word line WL4). In one approach, when WL5 is read a first time, WL7-15 is chosen as the selected subset and one of WL6-15 is randomly chosen as the another WL; when WL5 is read a second time, WL16-25 is chosen as the selected subset and one of WL16-25 is randomly chosen as the another WL, and so forth.

The another word line can be chosen and analyzed to obtain optimum read or other voltages each time the selected word line is read, or less often. For example, the decision of whether to choose another word line and obtain new voltages can be made randomly or non-randomly so that it occurs periodically at an average or fixed interval, respectively, with respect to a number of times a selected word line is read. Or, unequal increments can be used, e.g., after a selected word line is read four times, then after the selected word line is read eight times, and so forth.

The decision of whether to obtain new voltages can be initiated when a single word line is read multiple times without reading other word lines. If it is desired to avoid tracking the number of times a particular word line has been read, new voltages can be obtained each time any word line is read. With tracking of the number of times any word line in a block has been read, the decision can be made after every n>1 reads of any word line. With no tracking of the number of times any word line in a block has been read, the decision can be made on a random basis, e.g., using a random number generator to determine if a particular read invokes choosing another word line and obtaining new voltages. If a read operation involves all or a large part of an entire block, all storage elements will be subject to similar read disturb so it may not be necessary to choose a word line and obtain new voltages. Various other approaches are possible as well. The control can maintain appropriate data to implement the desired scheme.

Figure 8:
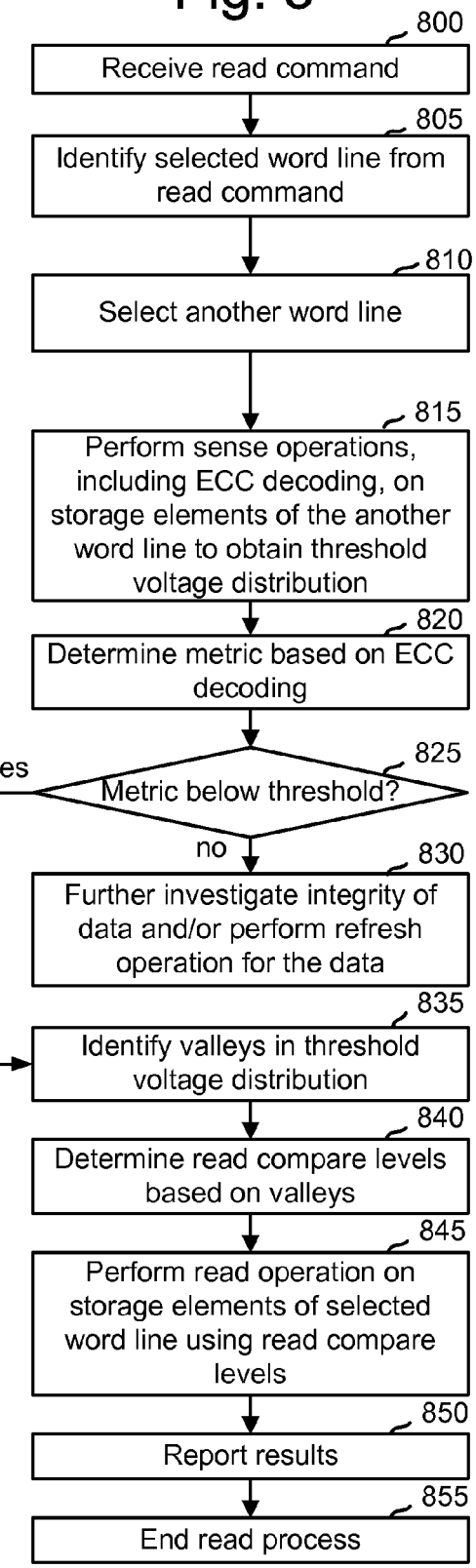
FIG. 8 depicts a process for setting read compare levels for reading a selected word line based on another word line and an error correction metric.

FIG. 8 depicts a process for setting read compare levels for reading a selected word line based on another word line and an error correction metric. Steps 800, 805 and 810 correspond to steps 700, 705 and 710, respectively, of FIG. 7. Step 815 includes performing sense operations, including ECC decoding, on storage elements of the another word line to obtain a threshold voltage distribution of those storage elements. Step 820 includes determining a metric based on the ECC decoding process. For example, the metric can indicate the amount of time and/or the number of iterations to converge. At decision step 825, if the metric is below a threshold, which can be set based on testing and/or theoretical calculations, the ECC decoding process is proceeding satisfactorily. In this case, the process proceeds to steps 835, 840, 845, 850 and 855, which correspond to steps 720, 725, 730, 735 and 740, respectively, of FIG. 7. At decision step 825, if the metric is not below the threshold, the ECC decoding process is not proceeding satisfactorily and, at step 830, a further investigation of the integrity of the data is made, and/or a refresh operation for the data is performed. The further investigation can include, e.g., additional exploratory reads of one or more additional word lines to determine whether they are also having trouble decoding. A refresh operation can involve, e.g., copying the data from a first block to a second block, erasing the first block, and copying the data back to the first block.

When step 810 selects a word line with worst case read disturb, such as the drain side neighbor of the selected word line, the error metric is more likely to exceed the threshold in step 825 than if a random selection is made.

Figure 9:
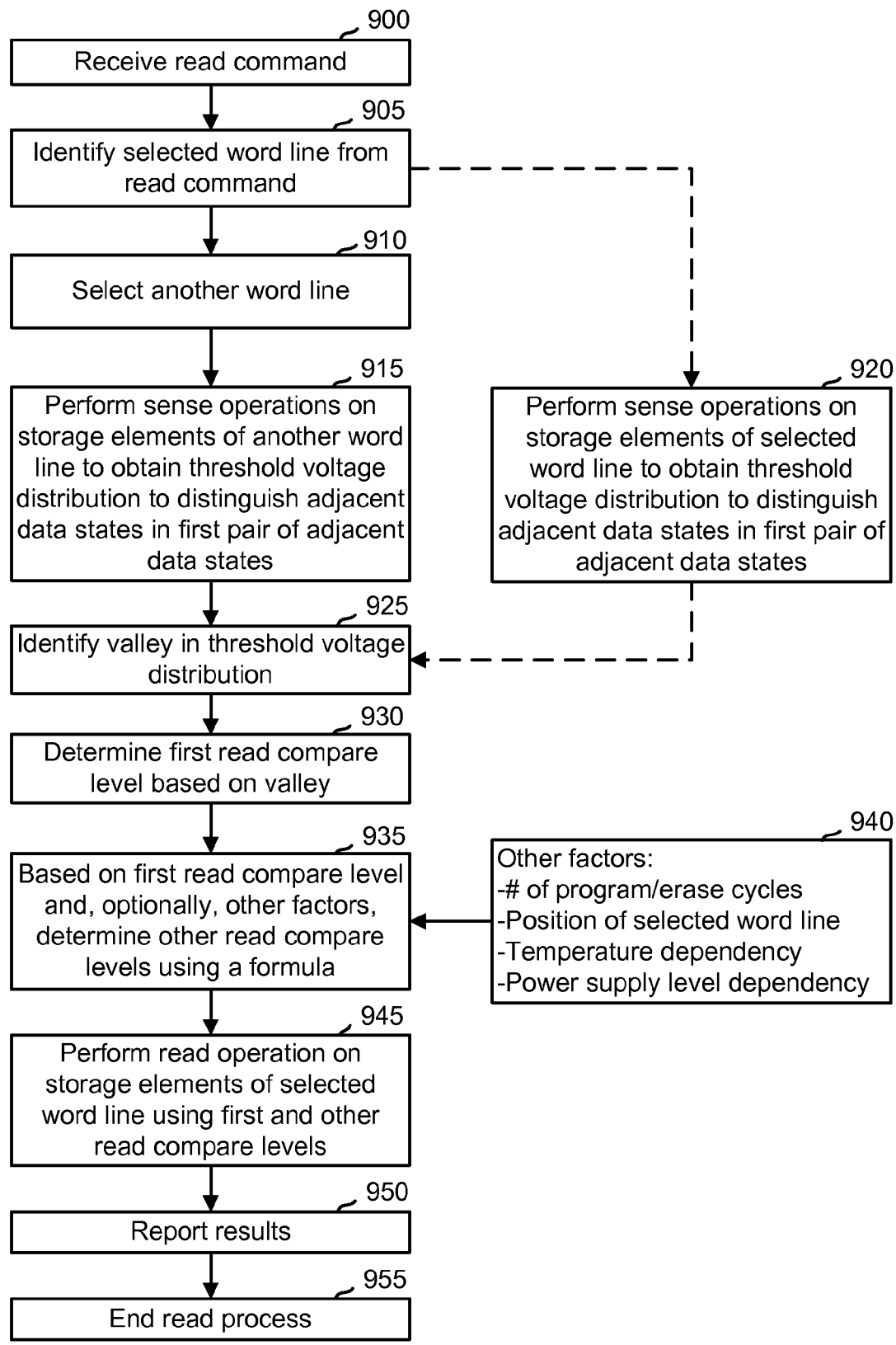
FIG. 9 depicts a process for setting read compare levels for reading a selected word line by determining additional read compare levels from a first read compare level.

FIG. 9 depicts a process for setting read compare levels for reading a selected word line by determining additional read compare levels from a first read compare level. As indicated in FIG. 5c, determining a threshold voltage distribution across all data states as part of DSPA requires a significant number of sense operations and is therefore processing-intensive. An alternative approach involves determining a threshold voltage distribution across fewer than all data states, and extrapolating the results to the other data states. For example, a threshold voltage distribution which is obtained can be limited to a range of voltages which is sufficient to distinguish between two adjacent data states, and an optimum read compare level can be determined from this result. Subsequently, optimum read compare levels for one or more other data states can be determined based on a formula. With this formula, an offset in the read compare level for a given data state relative to the baseline level can be translated to offsets for other data states, and the optimum read compare level for the other data states can be obtained from the known baseline levels and the respective offset. In one possible approach, the offsets are set equal to the measured offset, or to some fraction of the measured offset. The baseline read levels can be predetermined levels which are known to be optimum from testing and/or theoretical analysis when there is no read disturb.

For example, assume there are eight data states and seven read levels $V_{R1}$-$V_{R7}$. See also FIG. 5a-c. A threshold voltage distribution is performed which is sufficient to determine $V'_{R7}$. Once $V'_{R7}$ is determined, an offset $\Delta_7 = V_{R7} - V'_{R7}$ can be determined. Offsets for the other read levels can then be determined as a function of $\Delta_7$, e.g., $\Delta_1 = f1(\Delta_7)$, $\Delta_2 = f2(\Delta_7)$, $\Delta_3 = f3(\Delta_7)$, $\Delta_4 = f4(\Delta_7)$, $\Delta_5 = f5(\Delta_7)$, $\Delta_6 = f6(\Delta_7)$. Generally for state i, $\Delta_i = fi(\Delta_7)$, and $V'_{Ri} = V_{Ri} + \Delta_i$, where $V_{Ri}$ is the baseline read level. As an example, $\Delta_7$ may be 0.5 V, and the formula may indicate testing and/or theoretical analysis that the offset decreases for each lower read level, from which we determine that, e.g., $\Delta_1 = 0.4 \times \Delta_7 = 0.20$ V, $\Delta_2 = 0.5 \times \Delta_7 = 0.25$ V, $\Delta_3 = 0.6 \times \Delta_7 = 0.30$ V, $\Delta_4 = 0.7 \times \Delta_7 = 0.35$ V, $\Delta_5 = 0.8 \times \Delta_7 = 0.40$ V, and $\Delta_6 = 0.9 \times \Delta_7 = 0.45$ V. In this case, we calculate the optimum read compare levels for states 1-6 as $V'_{R1} = V_{R1} - 0.20$ V, $V'_{R2} = V_{R2} - 0.25$ V, $V'_{R3} = V_{R3} - 0.30$ V, $V'_{R4} = V_{R4} - 0.35$ V, $V'_{R5} = V_{R5} - 0.40$ V, and $V'_{R6} = V_{R6} - 0.45$ V. Here, we assume the offsets are negative, which is the case when the baseline read level is positive. If the baseline read level was negative, the offset would be positive.

Thus, we can read a voltage range that includes the two highest programmed states (e.g., states 6 and 7) in order to determine a first read compare voltage. Once that is determined, we determine the offsets for other states and the corresponding optimum read compare voltages.

Note that the highest states may provide a strong signal to noise ratio which allows us to accurately extrapolate the results to the other states since read disturb increases with threshold voltage. Based on a device level characterization of the particular technology of the memory device, we will be able to determine the offsets for all states once we know the offset for the highest state. It is also possible to obtain offsets for more than one, but fewer than all, data states, and to use these results to make the extrapolation to the other data states more accurate. Also, the next to highest state may also yield good results Since the valley between the distributions of the last two states has to be determined with a high degree of accuracy, the voltage space should be scanned with fine resolution. For example, a scan step size of 25 mV that scans a 400 mV range will result in 16 reads, which is a close number to the typical 15 reads (with no soft bits) performed on any page (assuming 16 data states). This insures that the $V_{READ}$ exposure that the selected word line experiences is, at a minimum, equivalent to the $V_{READ}$ exposure that the rest of the block is subjected to during the regular read of the selected word line. It can be argued that most of the unselected word lines will experience twice the exposure time to $V_{READ}$ as the selected word line. In consideration of this, the criteria for triggering a re-write can be made stricter.

Referring to FIG. 9, step 900 includes receiving a command to read data. Step 905 includes identifying a selected word line from the read command. Next, one of two paths can be followed: one involving an unselected word line and one involving the selected word line. In one path, step 910 includes choosing another word line. Step 915 includes performing sense operations on storage elements of the another word line to obtain a threshold voltage distribution which is sufficient to distinguish adjacent data states in a first pair of adjacent data states. In the second path, step 920 is the same as step 915 but involves the selected word line. In either case, step 925 includes identifying a valley in the threshold voltage distribution, and step 930 includes determining a first read compare level based on the valley. For instance, this can be $V'R7$ in FIG. 5c.

At step 935, based on the first read compare level and, optionally, other factors, we determine other read compare levels using a formula, such as discussed above. The other factors can include, e.g., the number of program/erase cycles, the position of the selected word line in the set of word lines, a temperature dependency and a power supply level dependency (box 940). For example, testing and/or theoretical calculations may indicate for a particular memory device that any of these variables affects the optimum read level. Moreover, an optimum read compare level which is optimum under one set of variables can be adjusted when another set of variables is present. For instance, the offsets of the different data states can vary based on the number of program/erase cycles. As an example, the offset for the higher states may increase relatively more than the offsets for the lower states. The formula which relates offsets of one state to another can be adjusted accordingly.

Similarly, it may be determined that an optimum read level for a given state which was determined for one word line should be adjusted for another word line based on the word line position. The word lines may be grouped in subsets of word lines that experience a relatively similar level of read disturb, e.g., source side word lines, middle word lines and drain side word lines.

Regarding a temperature dependency, the threshold voltage of a storage element decreases by −2 mV/° C. Also, more disturb occurs at higher temperatures. Thus, if the temperature is higher than some baseline level when the optimum read compare levels are determined, this fact should be accounted for so that the optimum read compare levels are adjusted accordingly when used later when the temperature is different. Temperature dependent circuitry can provide an indication of temperature. Various techniques are known for providing a temperature-dependent reference signal. In one possible approach, a band gap circuit is used. For example, U.S. Pat. No. 6,801,454, titled "Voltage Generation Circuitry Having Temperature Compensation," incorporated herein by reference, describes a voltage generation circuit which outputs read voltages to a non-volatile memory based on a temperature coefficient. The circuit uses a band gap current which includes a temperature-independent portion and a temperature-dependent portion which increases as temperature increases.

Regarding a power supply level dependency, it is possible for a power supply level to vary, even with compensation, as a result of which the voltages used during sensing can vary. Such variations can be tracked using appropriate circuitry to provide an appropriate adjustment for the optimum read compare levels.

Figure 10:
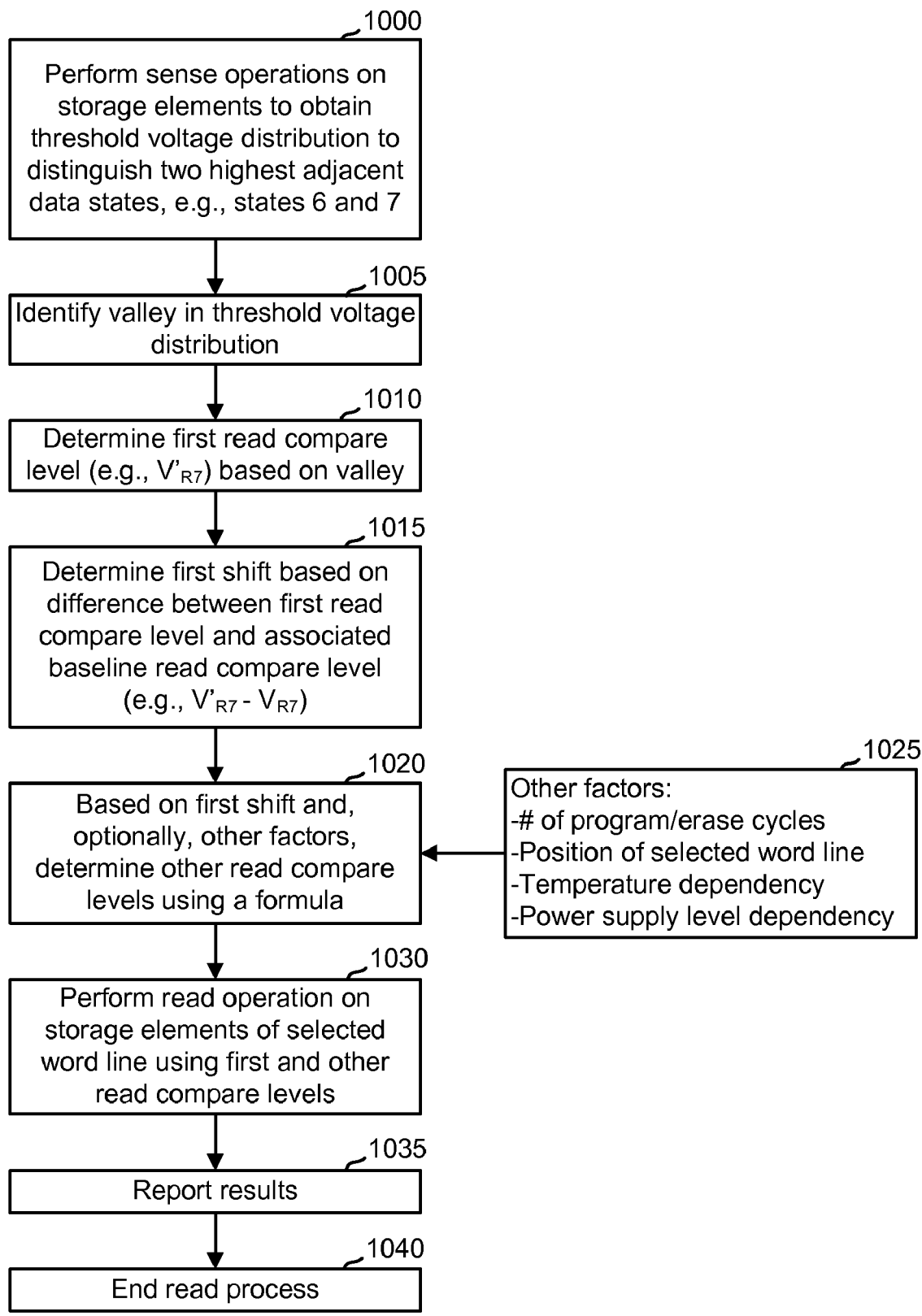
FIG. 10 depicts further details of a process for setting read compare levels for reading a selected word line by determining additional read compare levels from a first read compare level.

Step 945 includes performing a read operation on storage elements of the selected word line using the determined read compare levels, step 950 includes reporting the results, and the process ends at step 955. FIG. 10 depicts further details of a process for setting read compare levels for reading a selected word line by determining additional read compare levels from a first read compare level. Step 1000 includes performing sense operations on storage elements (of the selected word line or another word line) to obtain a threshold voltage distribution which is sufficient to distinguish the two highest adjacent data states, e.g., states 6 and 7 when there are eight states (see FIGS. 5*a-c*). The multiple data states extend from a lower range to a higher range, and the adjacent data states 6 and 7 are in the higher range.

Step 1005 includes identifying a valley in the threshold voltage distribution, and step 1010 includes setting a first read compare level (e.g., V'$_{R7}$) based on the valley. Step 1015 includes determining a first shift (e.g., $\Delta_7$) based on a difference between the first read compare level and an associated baseline read level (e.g., V'$_{R7}$−V$_{R7}$). At step 1020, based on the first shift and, optionally, other factors, other read compare levels are determined based on a formula. Each baseline read compare level can be modified by an associated threshold voltage shift to optimum a new, optimized compare level without performing additional sense operations for each compare level. Thus, optimized compare levels can be determined for data states which are in a lower range of states, e.g., V'$_{R1}$ for states 0 and 1, V'$_{R2}$ for states 1 and 2, and so forth. The other factors can include, e.g., the number of program/erase cycles, the position of the selected word line in the set of word lines, a temperature dependency and a power supply level dependency (box 1025). Step 1030 includes performing a read operation on storage elements of the selected word line using the determined read compare levels, step 1035 includes reporting the results, and the process ends at step 1045.

Figure 11:
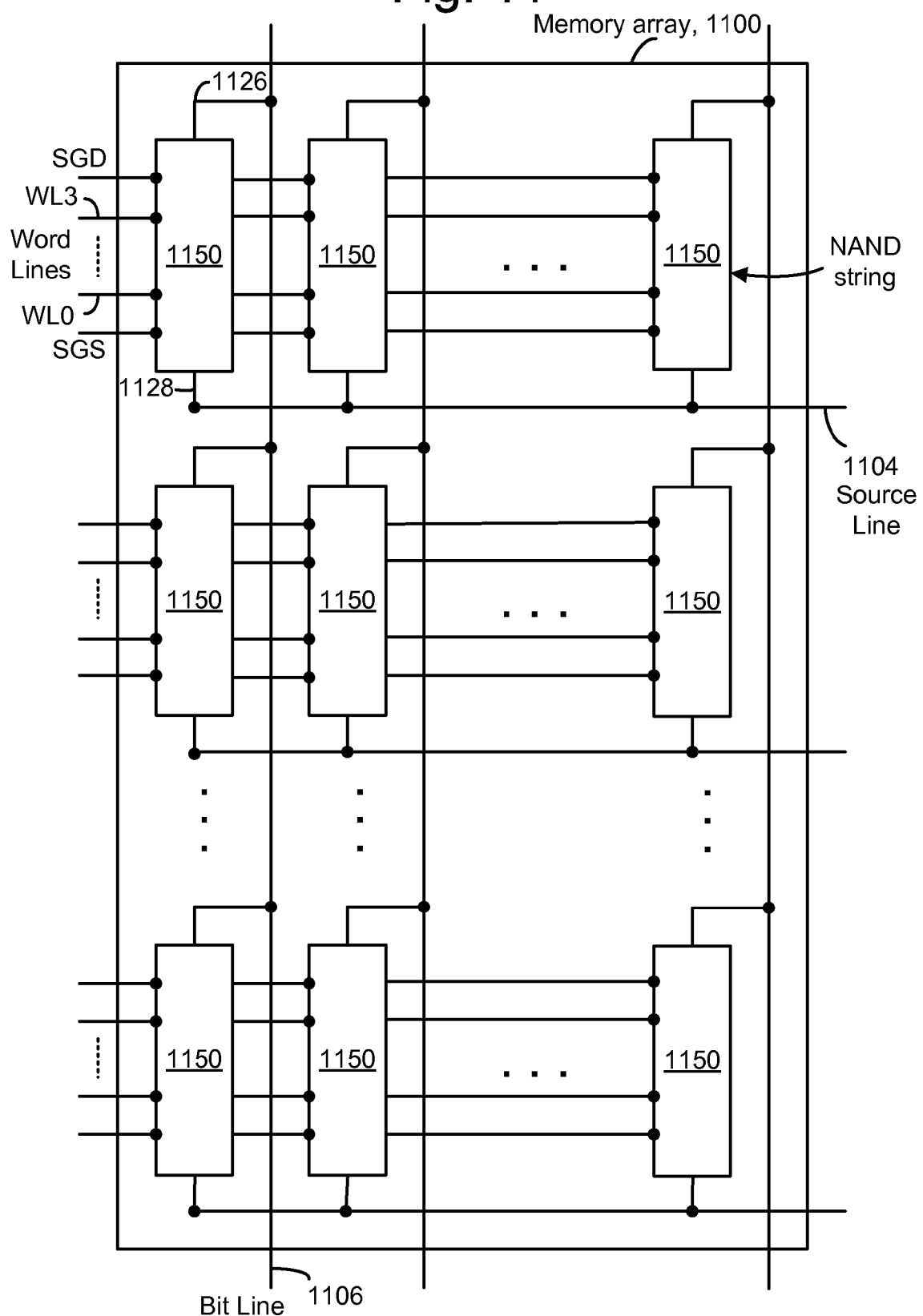
FIG. 11 is a block diagram of an array of NAND flash storage elements.

FIG. 11 illustrates an example of an array 1100 of NAND storage elements, such as those shown in FIGS. 1 and 2. Along each column, a bit line 1106 is coupled to the drain terminal 1126 of the drain select gate for the NAND string 1150. Along each row of NAND strings, a source line 1104 may connect all the source terminals 1128 of the source select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 12:
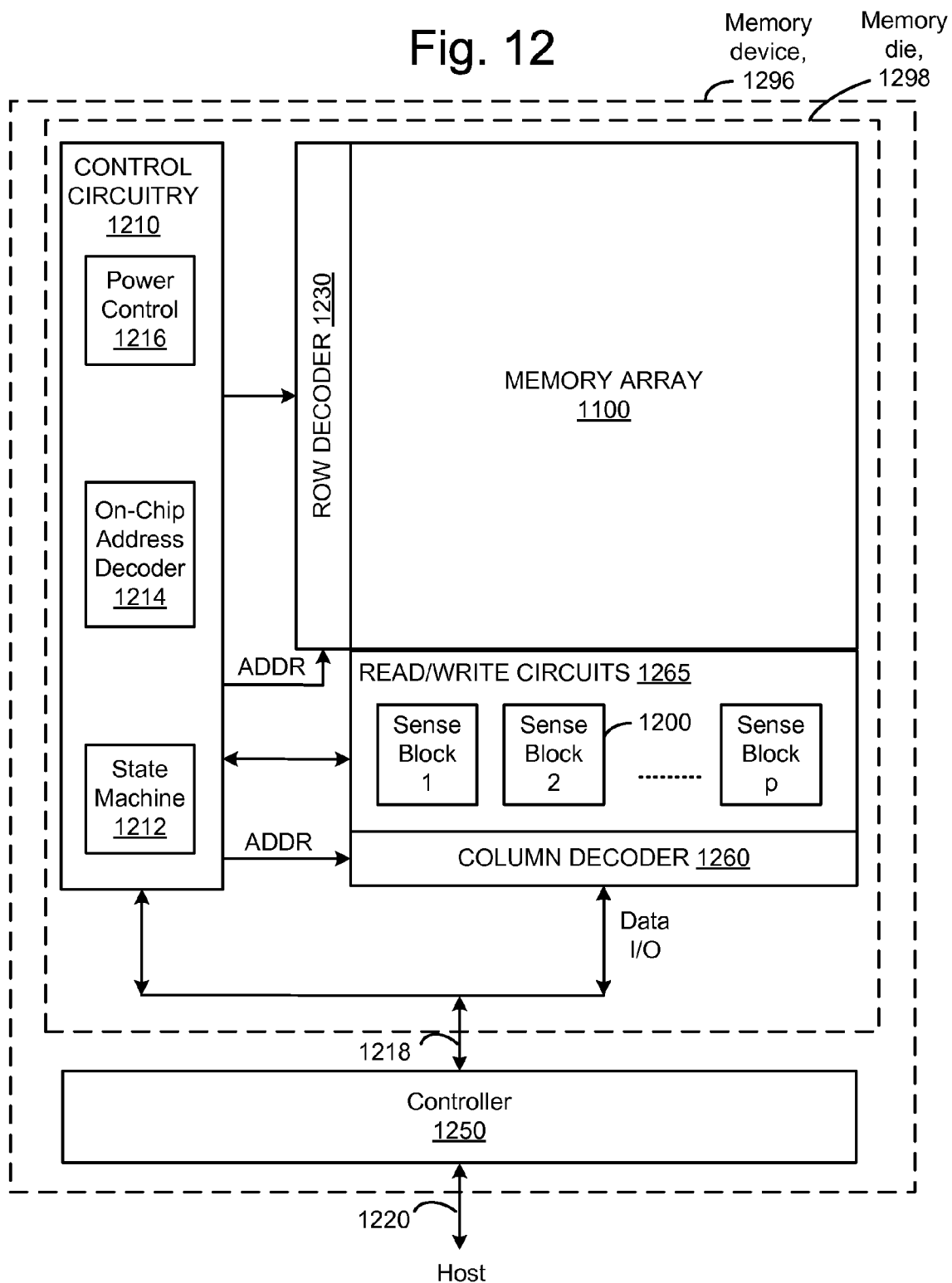
FIG. 12 is a block diagram of a non-volatile memory system using single row/column decoders and read/write circuits.

FIG. 12 is a block diagram of a non-volatile memory system using single row/column decoders and read/write circuits. The diagram illustrates a memory device 1296 having read/write circuits for reading and programming a page of storage elements in parallel, according to one embodiment of the present invention. Memory device 1296 may include one or more memory die 1298. Memory die 1298 includes a two-dimensional array of storage elements 1100, control circuitry 1210, and read/write circuits 1265. In some embodiments, the array of storage elements can be three dimensional. The memory array 1100 is addressable by word lines via a row decoder 1230 and by bit lines via a column decoder 1260. The read/write circuits 1265 include multiple sense blocks 1200 and allow a page of storage elements to be read or programmed in parallel. Typically a controller 1250 is included in the same memory device 1296 (e.g., a removable storage card) as the one or more memory die 1298. Commands and Data are transferred between the host and controller 1250 via lines 1220 and between the controller and the one or more memory die 1298 via lines 1218.

The control circuitry 1210 cooperates with the read/write circuits 1265 to perform memory operations on the memory array 1100. The control circuitry 1210 includes a state machine 1212, an on-chip address decoder 1214, and a power control module 1216. The state machine 1212 provides chip-level control of memory operations, including controlling pre-charging. The on-chip address decoder 1214 provides an address interface between that used by the host or a memory controller to the hardware address used by the decoders 1230 and 1260. The power control module 1216 controls the power and voltages supplied to the word lines and bit lines during memory operations.

In some implementations, some of the components of FIG. 12 can be combined. In various designs, one or more of the components (alone or in combination), other than storage element array 1100, can be thought of as a managing circuit. For example, one or more managing circuits may include any one of or a combination of control circuitry 1210, state machine 1212, decoders 1214/1260, power control 1216, sense blocks 1200, read/write circuits 1265, controller 1250, etc.

Figure 13:
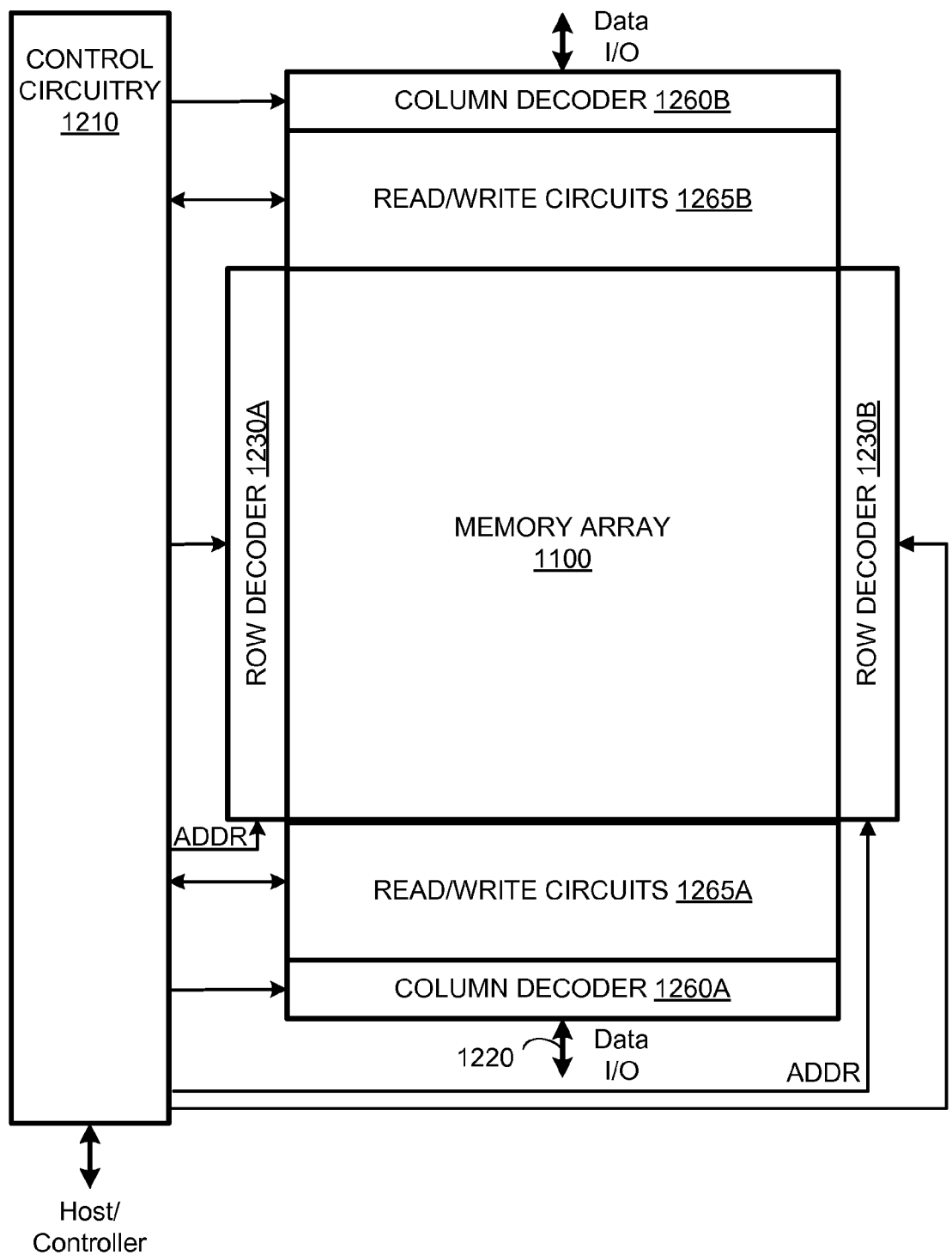
FIG. 13 is a block diagram of a non-volatile memory system using dual row/column decoders and read/write circuits.

FIG. 13 is a block diagram of a non-volatile memory system using dual row/column decoders and read/write circuits. Here, another arrangement of the memory device 1296 shown in FIG. 12 is provided. Access to the memory array 1100 by the various peripheral circuits is implemented in a symmetric fashion, on opposite sides of the array, so that the densities of access lines and circuitry on each side are reduced by half. Thus, the row decoder is split into row decoders 1230A and 1230B and the column decoder into column decoders 1260A and 1260B. Similarly, the read/write circuits are split into read/write circuits 1265A connecting to bit lines from the bottom and read/write circuits 1265B connecting to bit lines from the top of the array 1100. In this way, the density of the read/write modules is essentially reduced by one half. The device of FIG. 13 can also include a controller, as described above for the device of FIG. 12.

Figure 14:
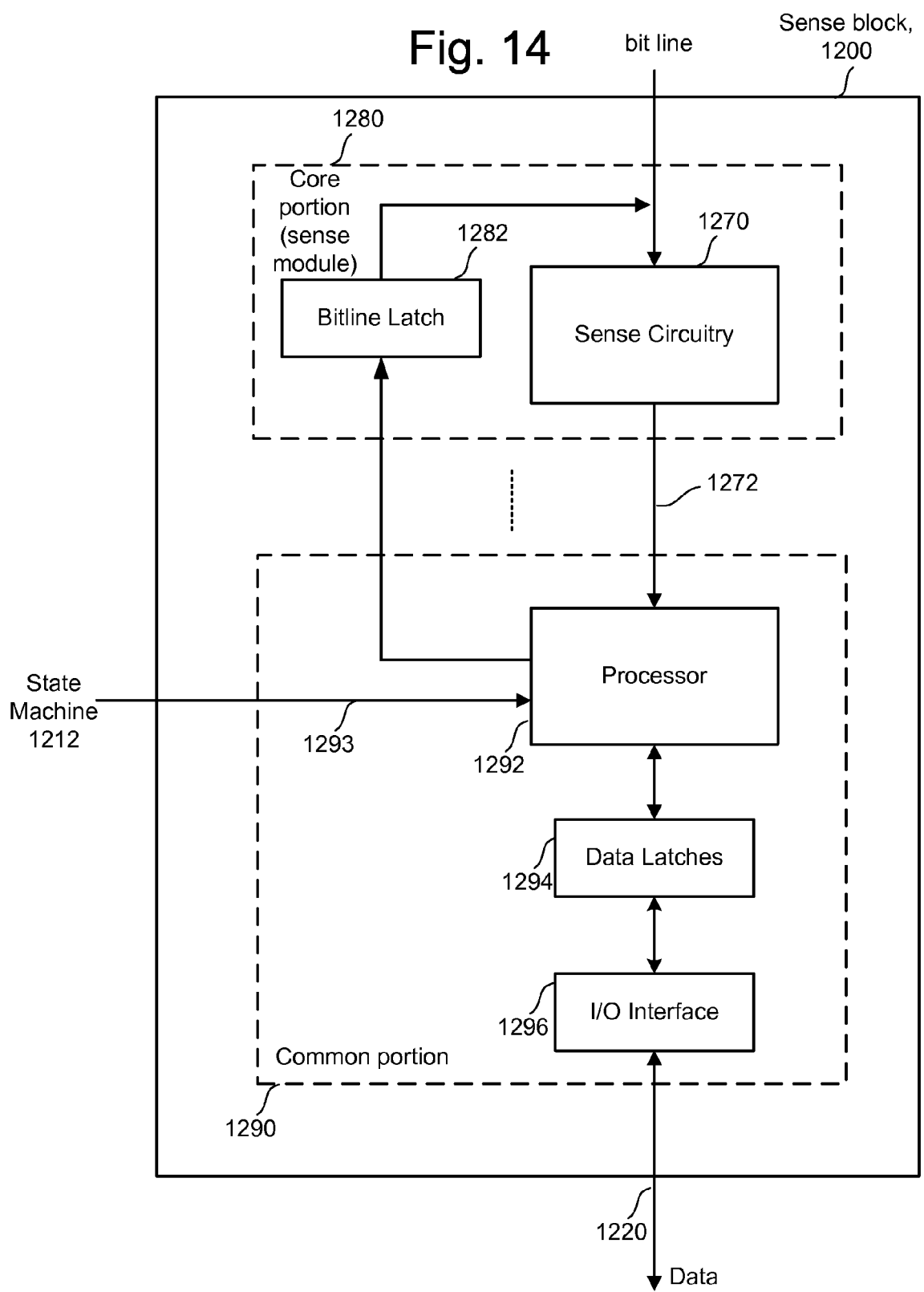
FIG. 14 is a block diagram depicting one embodiment of a sense block.

FIG. 14 is a block diagram depicting one embodiment of a sense block. An individual sense block 1200 is partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details refer to U.S. Patent Application Pub No. 2006/0140007, titled "Non-Volatile Memory and Method with Shared Processing for an Aggregate of Sense Amplifiers" published Jun. 29, 2006, and incorporated herein by reference in its entirety.

Sense module 1280 comprises sense circuitry 1270 that determines whether a conduction current in a connected bit line is above or below a predetermined threshold level. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., 1.5-3 V).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed storage element and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1212 that controls the supply of different control gate voltages to the addressed storage element. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1292 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1294 from the data bus 1220. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1292 monitors the read back memory state relative to the desired memory state. When the two are in agreement, the processor 1292 sets the bit line latch 1282 so as to cause the bit line to be pulled to a state designating program inhibit. This inhibits the storage element coupled to the bit line from further programming even if programming pulses appear on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are three data latches per sense module 1280. In some implementations (but not required), the data latches are implemented as a shift register so that the parallel data stored therein is converted to serial data for data bus 1220, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Pat. No. 7,196,931, titled, "Non-Volatile Memory And Method With Reduced Source Line Bias Errors," issued Mar. 27, 2007; (2) U.S. Pat. No. 7,023,736, title "Non-Volatile Memory And Method with Improved Sensing," issued Apr. 4, 2006; (3) U.S. Pat. No. 7,046,568, titled "Improved Memory Sensing Circuit And Method For Low Voltage Operation," issued May 16, 2006; (4) U.S. Pat. No. 7,196,928, titled "Compensating for Coupling During Read Operations of Non-Volatile Memory," issued Mar. 27, 2007; and (5) U.S. Pat. No. 7,327,619, titled "Reference Sense Amplifier For Non-Volatile Memory, issued Feb. 5, 2008. All five of the immediately above-listed patent documents are incorporated herein by reference in their entirety.

Figure 15:
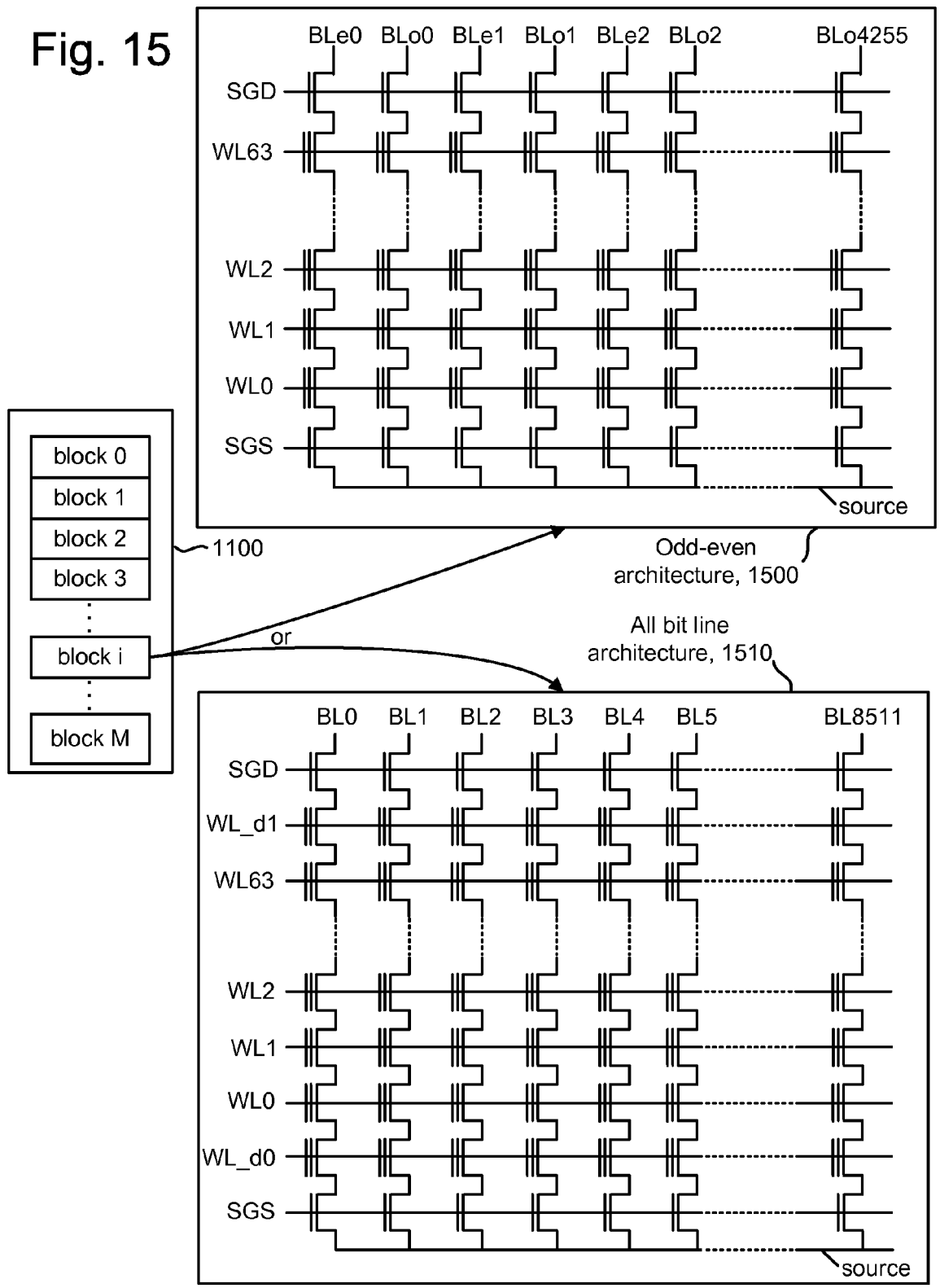
FIG. 15 illustrates an example of an organization of a memory array into blocks for an all bit line memory architecture or for an odd-even memory architecture.

FIG. 15 illustrates an example of an organization of a memory array into blocks for an all bit line memory architecture or for an odd-even memory architecture. Exemplary structures of memory array 1100 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1510), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1500), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 16:
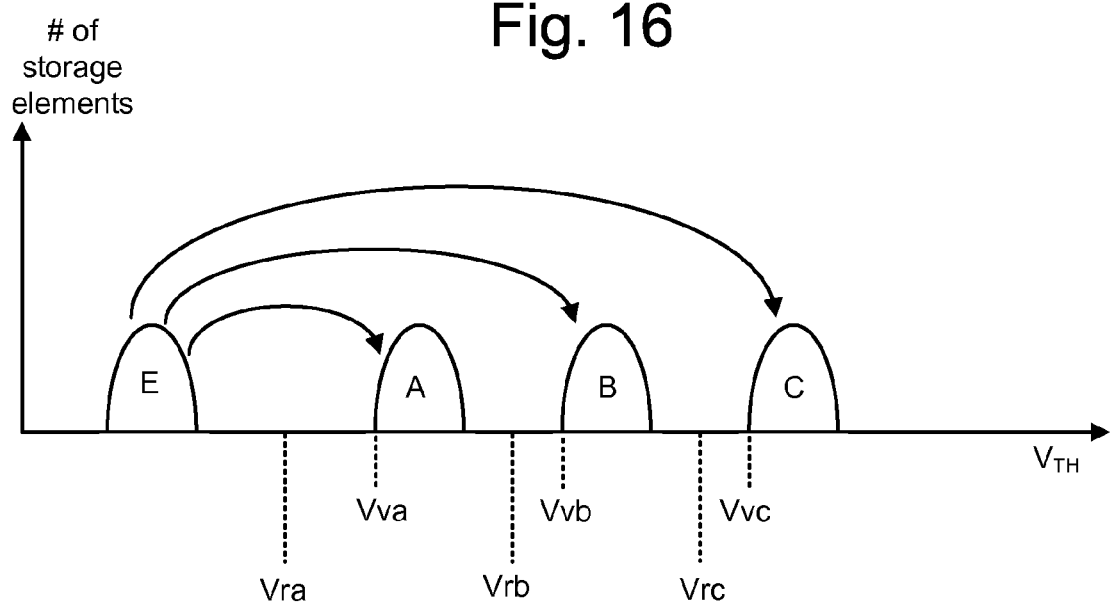
FIG. 16 depicts an example set of threshold voltage distributions and one-pass programming.

FIG. 16 depicts an example set of threshold voltage distributions and one-pass programming. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Pat. No. 7,237,074, issued Jun. 26, 2007, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 20 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Figure 17:
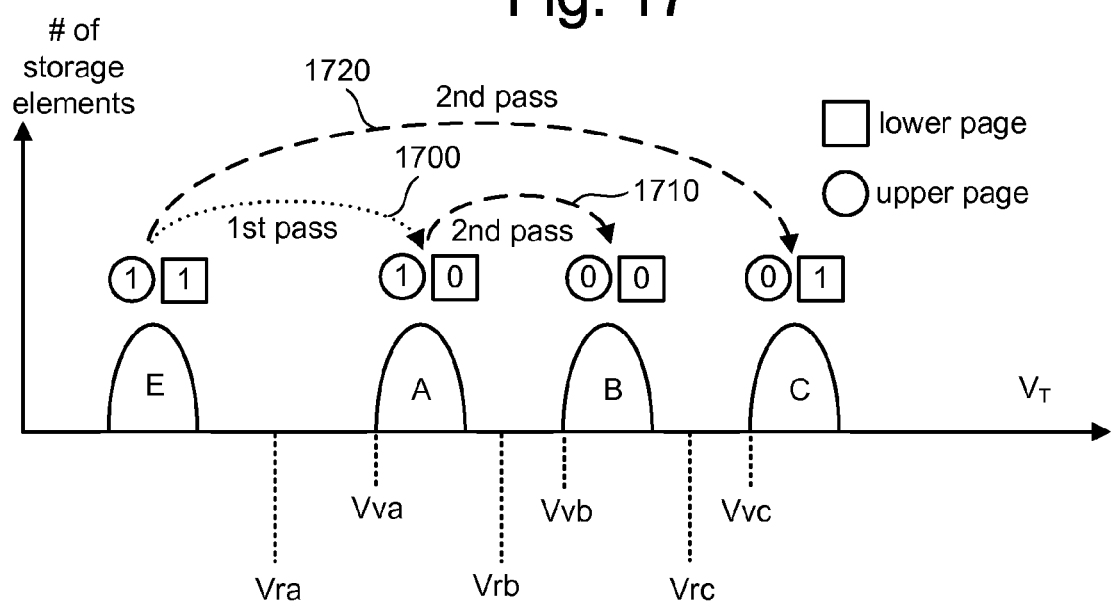
FIG. 17 depicts an example set of threshold voltage distributions and two-pass programming.

FIG. 17 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1700. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 1720. If the storage element had been programmed into state A as a result of the first programming pass, then the storage element is further programmed in the second pass so that the threshold voltage is increased to be within state B, as depicted by arrow 1710. The result of the second pass is to program the storage element into the state designated to store a logic "0" for the upper page without changing the data for the lower page. In both FIG. 16 and FIG. 17, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Pat. No. 7,120,051, titled "Pipelined Programming of Non-Volatile Memories Using Early Data," issued Oct. 10, 2006, incorporated herein by reference in its entirety.

Figure 18A:
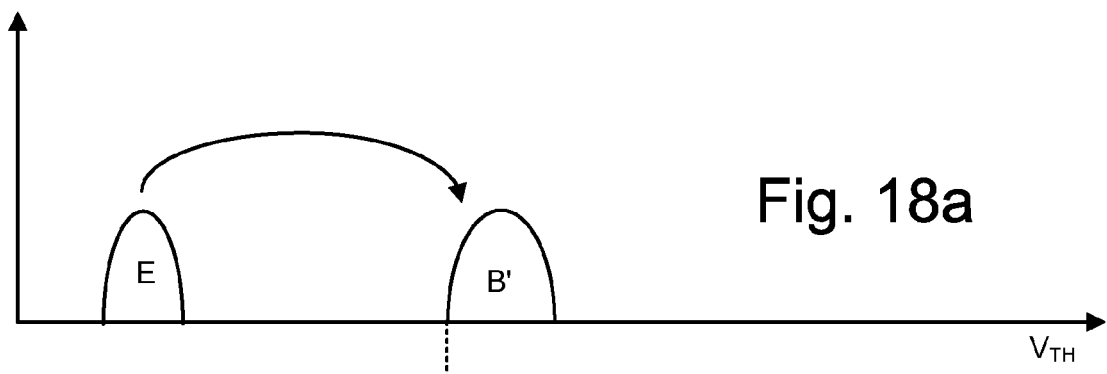
FIGS. 18a-c show various threshold voltage distributions and describe a process for programming non-volatile memory.
Figure 18B:
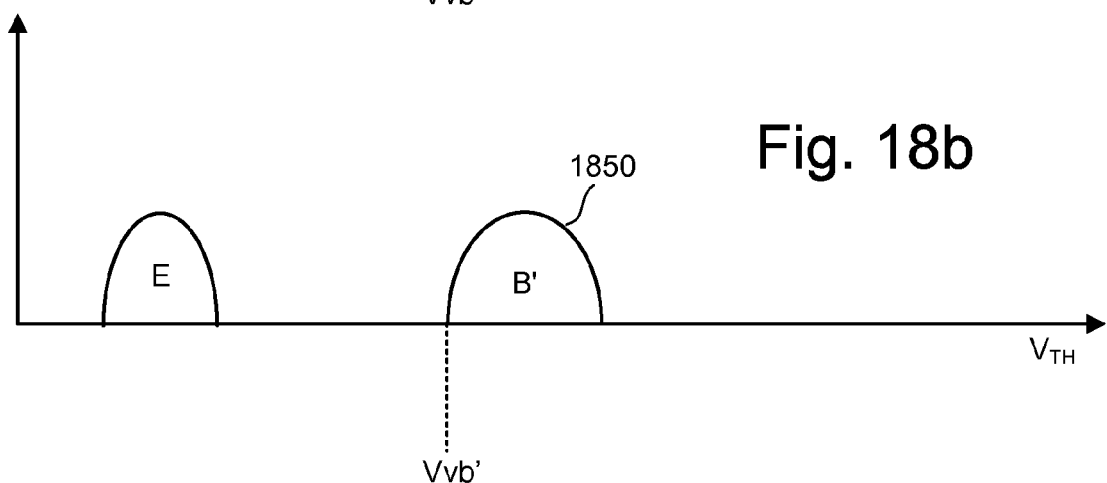
Figure 18C:
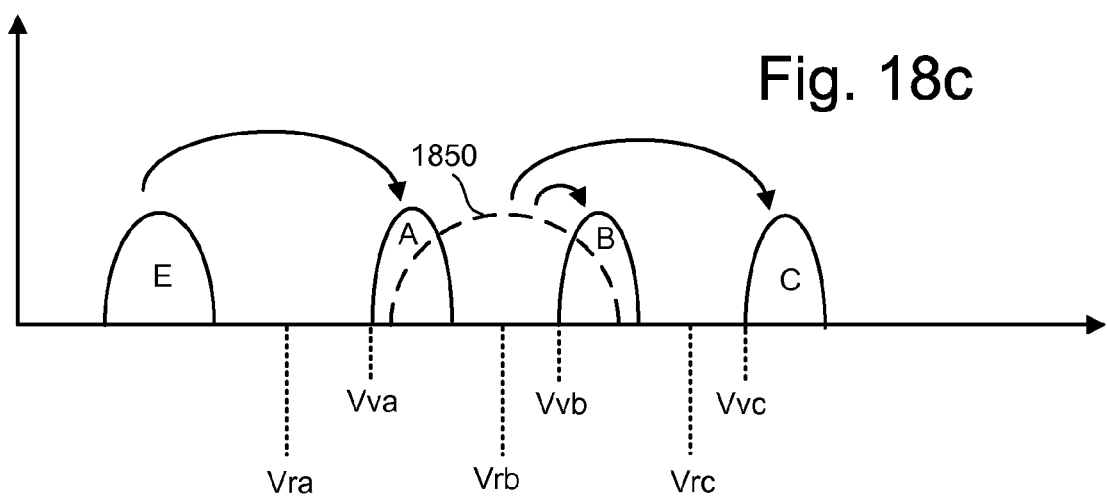

FIGS. 18*a-c* disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 18*a* therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1850 of FIG. 18b. This apparent widening of the threshold voltage distribution will be remedied when programming the upper page.

FIG. 18c depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 1850 and the upper page data is to remain at 1, then the storage element will be programmed to final state B. If the storage element is in intermediate threshold voltage distribution 1850 and the upper page data is to become data 0, then the threshold voltage of the storage element will be raised so that the storage element is in state C. The process depicted by FIGS. 18a-c reduces the effect of floating gate to floating gate coupling because only the upper page programming of neighbor storage elements will have an effect on the apparent threshold voltage of a given storage element. An example of an alternate state coding is to move from distribution 1850 to state C when the upper page data is a 1, and to move to state B when the upper page data is a 0.

Although FIGS. 18a-c provide an example with respect to four data states and two pages of data, the concepts taught can be applied to other implementations with more or fewer than four states and more or less than two pages.

Figure 19:
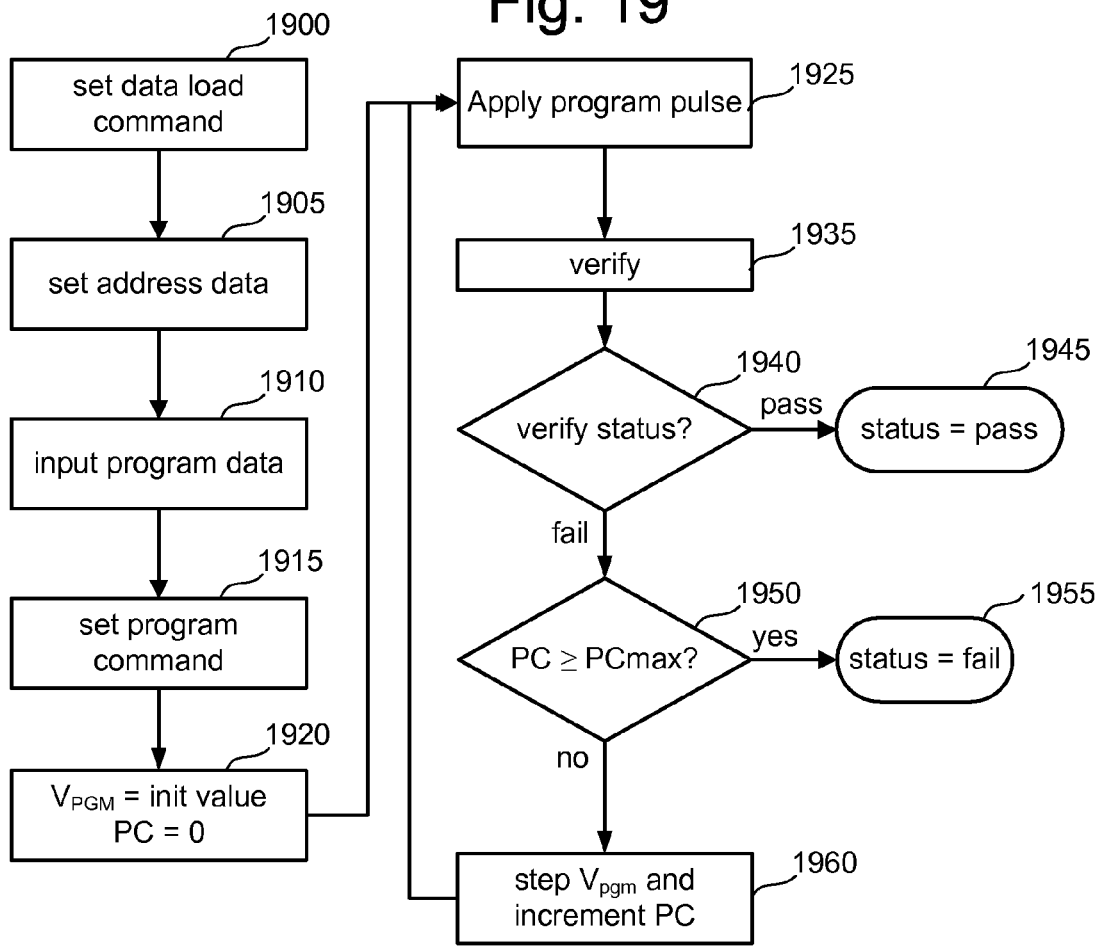
FIG. 19 is a flow chart describing one embodiment of a process for programming non-volatile memory.

FIG. 19 is a flow chart describing one embodiment of a method for programming non-volatile memory. In one implementation, storage elements are erased (in blocks or other units) prior to programming. In step 1900, a "data load" command is issued by the controller and input received by control circuitry 1210. In step 1905, address data designating the page address is input to decoder 1214 from the controller or host. In step 1910, a page of program data for the addressed page is input to a data buffer for programming. That data is latched in the appropriate set of latches. In step 1915, a "program" command is issued by the controller to state machine 1212.

Figure 20:
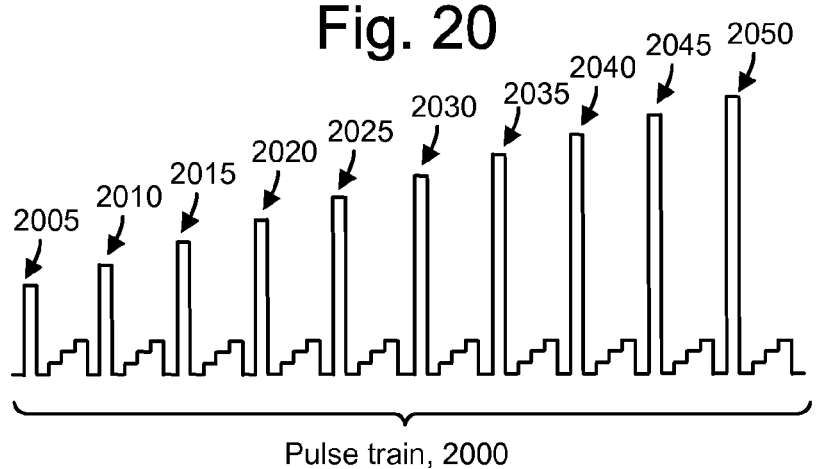
FIG. 20 depicts an example pulse train applied to the control gates of non-volatile storage elements during programming.

Triggered by the "program" command, the data latched in step 1910 will be programmed into the selected storage elements controlled by state machine 1212 using the stepped program pulses of the pulse train 2000 of FIG. 20 applied to the appropriate selected word line. In step 1920, the program voltage, $V_{PGM}$, is initialized to the starting pulse (e.g., 12 V or other value) and a program counter (PC) maintained by state machine 1212 is initialized at zero. In step 1925, the channels of the unselected bit lines are pre-charged, as discussed previously. At step 1930, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to 1.5-3 V to inhibit programming.

In step 1935, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 1940, a check is made as to whether all of the data latches are storing logic "1." If all of the data latches are storing logic "1," the programming process is complete and successful because all selected storage elements were programmed and verified. A status of "PASS" is reported in step 1945. In some embodiments, the programming process is considered complete and successful even if not all selected storage elements were verified as being programmed. In such a case, errors during subsequent read operations can occur due to insufficient programmed storage elements. However, these errors can be corrected by ECC.

If, in step 1940, it is determined that not all of the data latches are storing logic "1," then the programming process continues. In some embodiments, the program process stops even if not all of the data latches are storing logic "1". In step 1950, the program counter PC is checked against a program limit value PCmax. One example of a program limit value is twenty; however, other numbers can also be used. If the program counter PC is not less than PCmax, then the program process has failed and a status of "FAIL" is reported in step 1955. If the program counter PC is less than PCmax, then $V_{PGM}$ is increased by the step size and the program counter PC is incremented in step 1960. The process then loops back to step 1930 to apply the next $V_{PGM}$ pulse.

FIG. 20 depicts an example pulse train applied to the control gates of non-volatile storage elements during programming. The pulse train 2000 includes a series of program pulses 2005, 2010, 2015, 2020, 2025, 2030, 2035, 2040, 2045, 2050, ... , that are applied to a word line selected for programming. In one embodiment, the programming pulses have a voltage, $V_{PGM}$, which starts at 12 V and increases by increments, e.g., 0.5 V, for each successive programming pulse until a maximum of, e.g., 20-25 V is reached. In between the program pulses are verify pulses, e.g., three verify pulses. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 17) or Vvb' (FIG. 18a), for instance.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:

receiving a read command requesting to read data from at least one selected non-volatile storage element in a set of non-volatile storage elements, the at least one selected non-volatile storage element is associated with a selected word line in a set of word lines;

in response to the read command, selecting another word line in the set of word lines, performing sense operations on non-volatile storage elements which are associated with the another word line, and, based on the sense operations, determining at least one read compare level; and reading the at least one selected non-volatile storage element using the at least one read compare level.

2. The method of claim 1, wherein:
the sense operations provide a threshold voltage distribution which bridges at least two data states, and the at least one read compare level is determined by identifying a valley in the threshold voltage distribution.

3. The method of claim 1, further comprising:
selecting the another word line randomly from the set of word lines.

4. The method of claim 1, further comprising:
selecting the another word line randomly from the set of word lines, excluding at least one specified word line in the set of word lines.

5. The method of claim 1, wherein:
the another word line is adjacent to the selected word line.

6. The method of claim 1, further comprising:
determining multiple read compare levels for the non-volatile storage elements which are associated with the another word line, based on the sense operations; and
reading the at least one selected non-volatile storage element using the multiple read compare levels.

7. The method of claim 1, wherein the at least one read compare level comprises a first read compare level which distinguishes adjacent states of a first pair of data states from one another, the method further comprising:
determining a second read compare level which distinguishes adjacent states of a second pair of data states from one another, based on the first read compare level, and without performing sense operations for distinguishing the adjacent states of the second pair of data states from one another.

8. A method for operating non-volatile storage, comprising:
receiving a read command requesting to read data from at least one selected non-volatile storage element in a set of non-volatile storage elements, the set of non-volatile storage elements stores data in multiple data states, and the at least one selected non-volatile storage element is associated with a selected word line in a set of word lines;
in response to the read command, selecting another word line in the set of word lines, performing sense operations on non-volatile storage elements which are associated with the another word line to distinguish adjacent states of a first pair of data states of the multiple data states from one another, and, based on the sense operations, determining a first read compare level which is between the adjacent data states of the first pair of data states;
determining a second read compare level which is between adjacent data states of a second pair of data states of the multiple data states, based on the first read compare level, and without performing sense operations for distinguishing the adjacent states of the second pair of data states from one another; and
reading the at least one selected non-volatile storage element using at least the second read compare level.

9. The method of claim 8, wherein the determining the second read compare level comprises:

determining a first threshold voltage shift based on a difference between the first read compare level and an associated baseline read compare level;
determining a second threshold voltage shift based on the first threshold voltage shift; and
modifying an associated baseline read compare level of the second read compare level by the second threshold voltage shift.

10. The method of claim 8, further comprising:
reading the at least one selected non-volatile storage element using the second read compare level.

11. The method of claim 8, further comprising:
determining a third read compare level which is between adjacent data states of a third pair of data states, based on the first read compare level, without performing sense operations to distinguish the adjacent states of the third pair of data states from one another.

12. The method of claim 8, wherein:
the multiple data states extend from a lower range to a higher range; and
the adjacent data states of the first pair of data states are in the higher range, and the adjacent data states of the second pair of data states are in the lower range.

13. The method of claim 8, wherein:
the determining the second read compare level is also based on a number of write/erase cycles experienced by the set of non-volatile storage elements.

14. The method of claim 8, wherein:
the determining the second read compare level is also based on a position of the selected word line in the set of word lines.

15. The method of claim 8, wherein:
the determining the second read compare level is also based on a temperature dependency.

16. The method of claim 8, wherein:
the determining the second read compare level is also based on a power supply level dependency.

17. The method of claim 8, further comprising:
the another word line is selected randomly from the set of word lines.

18. A method for operating non-volatile storage, comprising:
receiving a read command requesting to read data from a set of non-volatile storage elements, the set of non-volatile storage elements stores data in multiple data states;
in response to the read command, performing sense operations to distinguish adjacent states of a first pair of data states of the multiple data states from one another, and, based on the sense operations, determining a first read compare level which is between the adjacent data states of the first pair of data states;
determining a second read compare level which is between adjacent data states of a second pair of data states of the multiple data states, based on the first read compare level, and without performing sense operations for distinguishing the adjacent states of the second pair of data states from one another; and
reading at least one selected non-volatile storage element using at least the second read compare level.

19. The method of claim 18, wherein:
the multiple data states extend from a lower range to a higher range; and
the adjacent data states of the first pair of data states are in the higher range, and the adjacent data states of the second pair of data states are in the lower range.

20. The method of claim 18, wherein:
the determining the second read compare level is also based on a number of write/erase cycles experienced by the set of non-volatile storage elements.

21. The method of claim 18, wherein:
the determining the second read compare level is also based on a position of the selected word line in the set of word lines.

22. The method of claim 18, wherein:
the determining the second read compare level is also based on a temperature-dependency.

23. A non-volatile storage system, including:
a set of non-volatile storage elements, including at least one selected non-volatile storage element;
a set of word lines associated with the set of non-volatile storage elements, including a selected word line, where the at least one selected non-volatile storage element is associated with the selected word line; and
at least one control circuit in communication with the set of word lines, the at least one control circuit: (a) receives a read command requesting to read data from the at least one selected non-volatile storage element which is associated with the selected word line, (b) in response to the read command, selects another word line in the set of word lines, performs sense operations on non-volatile storage elements which are associated with the another word line, and based on the sense operations, determines at least one read compare level, and (c) reads the at least one selected non-volatile storage element using the at least one read compare level.

24. The non-volatile storage system of claim 23, wherein:
the sense operations provide a threshold voltage distribution which bridges at least two data states, and the at least one read compare level is determined by identifying a valley in the threshold voltage distribution.

25. The non-volatile storage system of claim 23, wherein the at least one control circuit:
determines multiple read compare levels for the non-volatile storage elements which are associated with the another word line, based on the sense operations; and
reads the at least one selected non-volatile storage element using the multiple read compare levels.

26. The non-volatile storage system of claim 23, wherein the at least one read compare level comprises a first read compare level which distinguishes adjacent states of a first pair of data states from one another, and the at least one control circuit:
determines a second read compare level which distinguishes adjacent states of a second pair of data states from one another, based on the first read compare level, and without performing sense operations for distinguishing the adjacent states of the second pair of data states from one another.

* * * * *